(12) United States Patent
Arai

(10) Patent No.: US 8,674,514 B2
(45) Date of Patent: *Mar. 18, 2014

(54) WIRING BOARD, MANUFACTURING METHOD OF THE WIRING BOARD, AND SEMICONDUCTOR PACKAGE

(75) Inventor: Tadashi Arai, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 169 days.

This patent is subject to a terminal disclaimer.

(21) Appl. No.: 12/940,119

(22) Filed: Nov. 5, 2010

(65) Prior Publication Data

US 2011/0133342 A1    Jun. 9, 2011

(30) Foreign Application Priority Data

Dec. 7, 2009    (JP) ................. 2009-277889

(51) Int. Cl.
    *H01L 23/48*    (2006.01)
(52) U.S. Cl.
    USPC ............. 257/774; 257/E23.011; 257/E21.597
(58) Field of Classification Search
    USPC ........................ 257/774, E23.011, E21.597
    See application file for complete search history.

(56) References Cited

U.S. PATENT DOCUMENTS

| | | | | |
|---|---|---|---|---|
| 5,102,719 | A * | 4/1992 | Kumagai et al. | 428/209 |
| 5,111,278 | A * | 5/1992 | Eichelberger | 257/698 |
| 6,617,681 | B1 | 9/2003 | Bohr | |
| 7,393,758 | B2 | 7/2008 | Sridhar et al. | |

| | | | | |
|---|---|---|---|---|
| 2008/0239685 | A1 * | 10/2008 | Kawabe et al. | 361/782 |
| 2010/0014261 | A1 * | 1/2010 | Inagaki et al. | 361/763 |
| 2010/0133704 | A1 * | 6/2010 | Marimuthu et al. | 257/778 |

FOREIGN PATENT DOCUMENTS

| | | |
|---|---|---|
| JP | H05-198697 | 8/1993 |
| JP | 10-012805 | 1/1998 |
| JP | 2002-299486 | 10/2002 |
| JP | 2003-503855 | 1/2003 |
| JP | 2004-140286 | 5/2004 |
| JP | 2004-349603 | 12/2004 |
| JP | 2005-203680 | 7/2005 |
| JP | 2006-012687 | 1/2006 |
| JP | 2006-019425 | 1/2006 |
| JP | 2008-160019 | 7/2008 |

(Continued)

OTHER PUBLICATIONS

Office Action dated Jun. 18, 2013 issued with respect to the basic Japanese Patent Application No. 2009-277889.

(Continued)

*Primary Examiner* — Marc Armand
(74) *Attorney, Agent, or Firm* — IPUSA, PLLC

(57) ABSTRACT

A wiring board includes a ceramic substrate including a plurality of stacked ceramic layers, an internal wiring, and an electrode, the internal wiring being electrically connected to the electrode, the electrode being exposed from a first surface of the ceramic substrate; and a silicon substrate including a wiring layer, the wiring layer including a wiring pattern and a via-fill, the wiring pattern being formed on a main surface of the silicon substrate, an end of the via-fill being electrically connected to the wiring pattern, another end of the via-fill being exposed from a rear surface of the silicon substrate positioned opposite to the main surface, wherein the rear surface of the silicon substrate is anodically bonded to the first surface of the ceramic substrate; and the via-fill of the silicon substrate is directly connected to the electrode of the ceramic substrate.

10 Claims, 38 Drawing Sheets

(56) References Cited

FOREIGN PATENT DOCUMENTS

| | | |
|---|---|---|
| JP | 2009-515338 | 4/2009 |
| JP | 2009-280417 | 12/2009 |
| WO | WO01/01486 A1 | 1/2001 |
| WO | WO 2009/016862 | 2/2009 |

OTHER PUBLICATIONS

Office Action dated Jan. 7, 2014 issued with respect to the basic Japanese Patent Application No. 2009-277889.

* cited by examiner

WIRING BOARD, MANUFACTURING METHOD OF THE WIRING BOARD, AND SEMICONDUCTOR PACKAGE

CROSS-REFERENCE TO RELATED APPLICATIONS

This patent application is based upon and claims the benefit of priority of Japanese Patent Application No. 2009-277889 filed on Dec. 7, 2009 the entire contents of which are incorporated herein by reference.

BACKGROUND OF THE INVENTION

1. Field of the Invention

The present invention generally relates to wiring boards, manufacturing methods of the wiring boards, and semiconductor packages. More specifically, the present invention relates to a wiring board including silicon and ceramic, a manufacturing method of the wiring board, and a semiconductor package.

2. Description of the Related Art

Conventionally, a semiconductor package where a semiconductor chip is mounted on a wiring board via a solder bump or the like has been known. In such a semiconductor package, the wiring board works as an interposer configured to connect the semiconductor chip and a mounting board such as a motherboard. An example of a related art semiconductor package having a wiring board as an interposer is discussed with reference to FIG. 1 through FIG. 3.

FIG. 1 is a cross-sectional view of an example of the related art semiconductor package. As shown in FIG. 1, in a semiconductor package 500, a semiconductor chip 200 is mounted on a substantially center part of a wiring board 100 via solder bumps 300 and is sealed by underfill resin 400.

The wiring board 100 has a structure of a first wiring layer 110, a first insulation layer 140, a second wiring layer 120, a second insulation layer 150, a third wiring layer 130 and a solder resist layer 160. The first wiring layer 110 and the second wiring layer 120 are electrically connected to each other via first via holes 140x provided in the first insulation layer 140. The second wiring layer 120 and the third wiring layer 130 are electrically connected to each other via second via holes 150x provided in the second insulation layer 150.

External connecting terminals 170 such as solder balls are formed on the third wiring layer 130 exposed in opening parts 160x of the solder resist layer 160. The first wiring layer 110 works as electrode pads to be connected to electrode pads 220 of the semiconductor chip 200. The external connecting terminal 170 works as a terminal to be connected to the mounting board such as the motherboard. It is general practice that the wiring board 100 has, due to limitations of a wiring width, a diameter of the via hole, and other factors, a multi-layer structure.

The semiconductor chip 200 includes a semiconductor substrate 210 and the electrode pads 220. The semiconductor substrate 210 has a structure where a semiconductor integrated circuit (not illustrated in FIG. 1) is formed on the substrate 210 made of, for example silicon (Si). The electrode pads 220 are formed on one side of the semiconductor substrate 210 and electrically connected to the semiconductor integrated circuit (not illustrated in FIG. 1).

The first wiring layer 110 of the wiring board 100 and the electrode pads 220 of the semiconductor chip 200 are electrically connected to each other via the solder bumps 300. The underfill resin 400 is supplied between a surface of the semiconductor chip 200 and a surface of the wiring board 100, the surfaces facing each other.

Next, a manufacturing method of the related art semiconductor package is discussed. FIG. 2 and FIG. 3 are views of examples of manufacturing steps of the related art semiconductor package. In FIG. 2 and FIG. 3, parts that are the same as the parts shown in FIG. 1 are given the same reference numerals, and explanation thereof is omitted.

First, in a step illustrated in FIG. 2, the wiring board 100 and the semiconductor chip 200 manufactured by known methods are provided. A pre-solder 410 is formed on the first wiring layer 110 of the wiring board 100. A pre-solder 420 is formed on the electrode pads 220 of the semiconductor chip 200.

Next, in a step illustrated in FIG. 3, the first wiring layer 110 side of the wiring board 100 and the electrode pad 220 side of the semiconductor chip 200 are made to face each other so that the pre-solders 410 and 420 are positioned so as to face each other. Then, the pre-solders 410 and 420 are heated at, for example, approximately 230° C. so that the solders are melted and thereby the solder bumps 300 are formed.

Next, the underfill resin 400 is supplied between the surfaces facing each other of the semiconductor chip 200 and the wiring board 100 in a structural body illustrated at a lower side in FIG. 3, so that the semiconductor package 500 including the semiconductor chip 200 illustrated in FIG. 1 is completed. Since a warp may be formed at the wiring board 100 due to shrinkage on curing of the underfill resin 400, it is necessary for the wiring board 100 to have thickness greater than a certain thickness.

The semiconductor package 500 is connected to the mounting board such as the motherboard via the external connecting terminals 170. Thus, in the semiconductor package 500, the wiring board 100 works as an interposer configured to connect the semiconductor chip 200 and the mounting board such as the motherboard. See Japanese National Publication of International Patent Application No. 2003-503855.

However, in the development of down-sizing, miniaturization of the semiconductor chips is continuing. Therefore, minute wiring is required for the interposer where the semiconductor chip is mounted. Therefore, it becomes difficult to respond to the minute wiring required for the interposer by using the related art wiring board illustrated in FIG. 1. Because of this, although the interposers having a silicon base multi-layer structure which can correspond to the minute wiring are being studied, the cost of manufacturing equipment for achieving the required multi-layer structure is increasing so that the manufacturing cost is increased.

SUMMARY OF THE INVENTION

Accordingly, embodiments of the present invention may provide a novel and useful wiring board, a manufacturing method of the wiring board, and a semiconductor package solving one or more of the problems discussed above.

More specifically, the embodiments of the present invention may provide a wiring board which can prevent increase of the manufacturing cost and correspond to minute wiring, a manufacturing method of the wiring board, and a semiconductor package.

Another aspect of the embodiments of the present invention may be to provide a wiring board, including a ceramic substrate including a plurality of stacked ceramic layers, an internal wiring, and an electrode, the internal wiring being electrically connected to the electrode, the electrode being exposed from a first surface of the ceramic substrate; and a silicon substrate including a wiring layer, the wiring layer including a wiring pattern and a via-fill, the wiring pattern being formed on a main surface of the silicon substrate, an end of the via-fill being electrically connected to the wiring pattern, another end of the via-fill being exposed from a rear surface of the silicon substrate positioned opposite to the main surface, wherein the rear surface of the silicon substrate is anodically bonded to the first surface of the ceramic substrate; and the via-fill of the silicon substrate is directly connected to the electrode of the ceramic substrate.

Another aspect of the embodiments of the present invention may be to provide a manufacturing method of a wiring board, including a first step of providing a ceramic substrate, the ceramic substrate having a plurality of stacked ceramic layers, an internal wiring, and an electrode electrically connected to the internal wiring, the electrode is exposed from a first surface of the ceramic substrate; a second step of providing a substrate main body made of silicon and anodically bonding a rear surface of the substrate main body to the first surface of the ceramic substrate; and a third step of forming a wiring layer to be electrically connected to the electrode on a main surface opposite to the rear surface of the substrate main body being anodically bonded.

Another aspect of the embodiments of the present invention may be to provide a semiconductor package, including the wiring board mentioned above; and a semiconductor chip mounted on the main surface of the silicon substrate of the wiring board.

Additional objects and advantages of the embodiments are set forth in part in the description which follows, and in part will become obvious from the description, or may be learned by practice of the invention. The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

A description is given below, with reference to the FIG. 4 through FIG. 38 of embodiments of the present invention.
(First Embodiment)
[Structure of Wiring Board of the First Embodiment]

Figure 1:
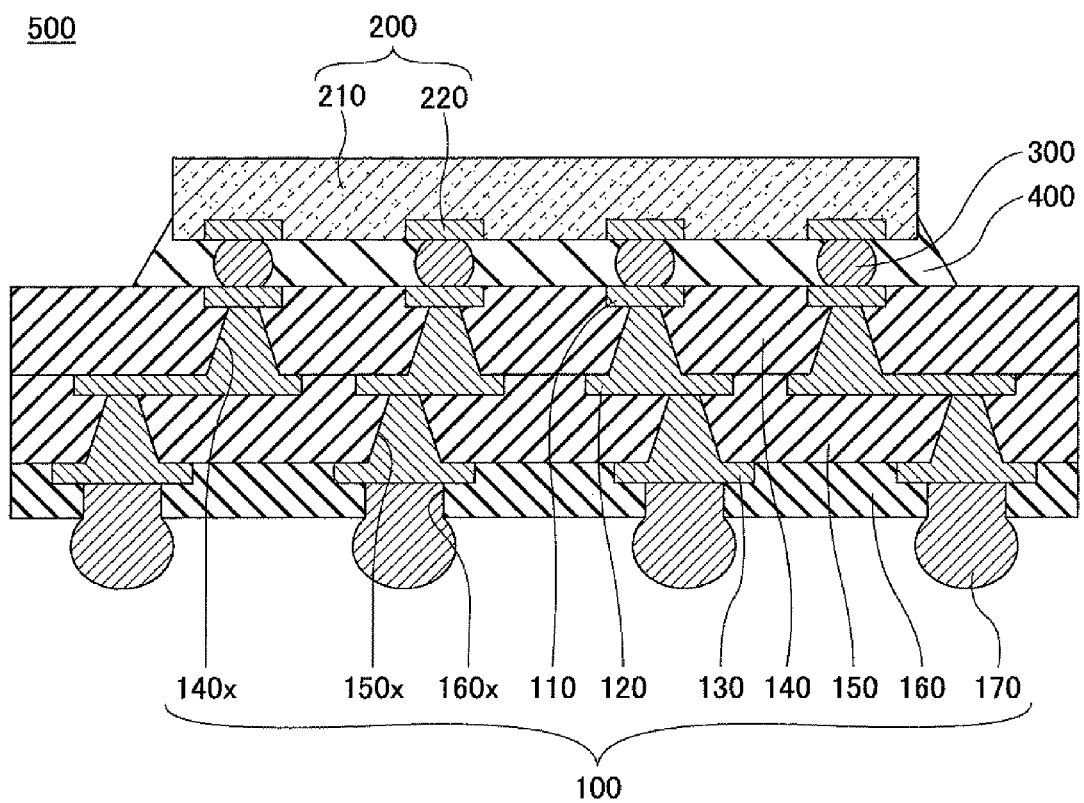
FIG. 1 is a cross-sectional view of an example of a related art semiconductor package.
Figure 2:
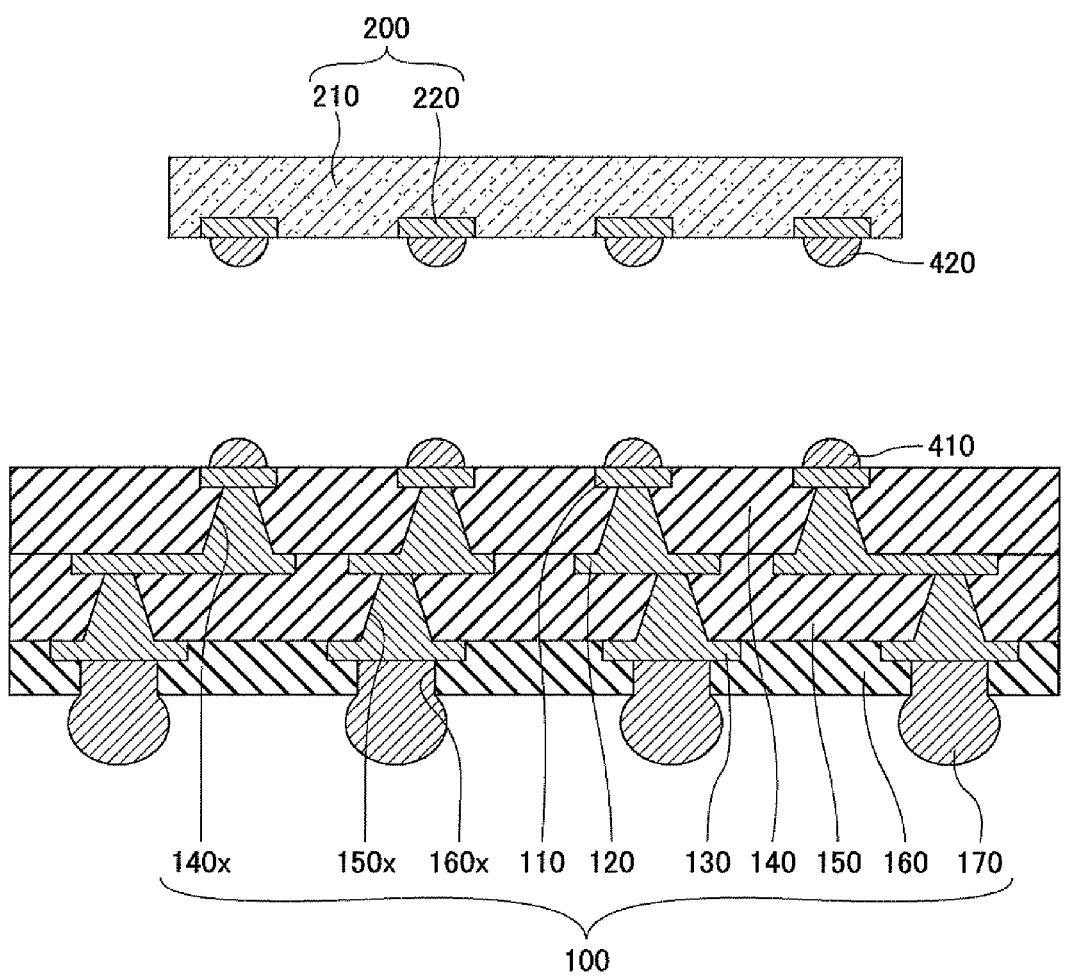
FIG. 2 is a first view of an example of manufacturing steps of the related art semiconductor package.
Figure 3:
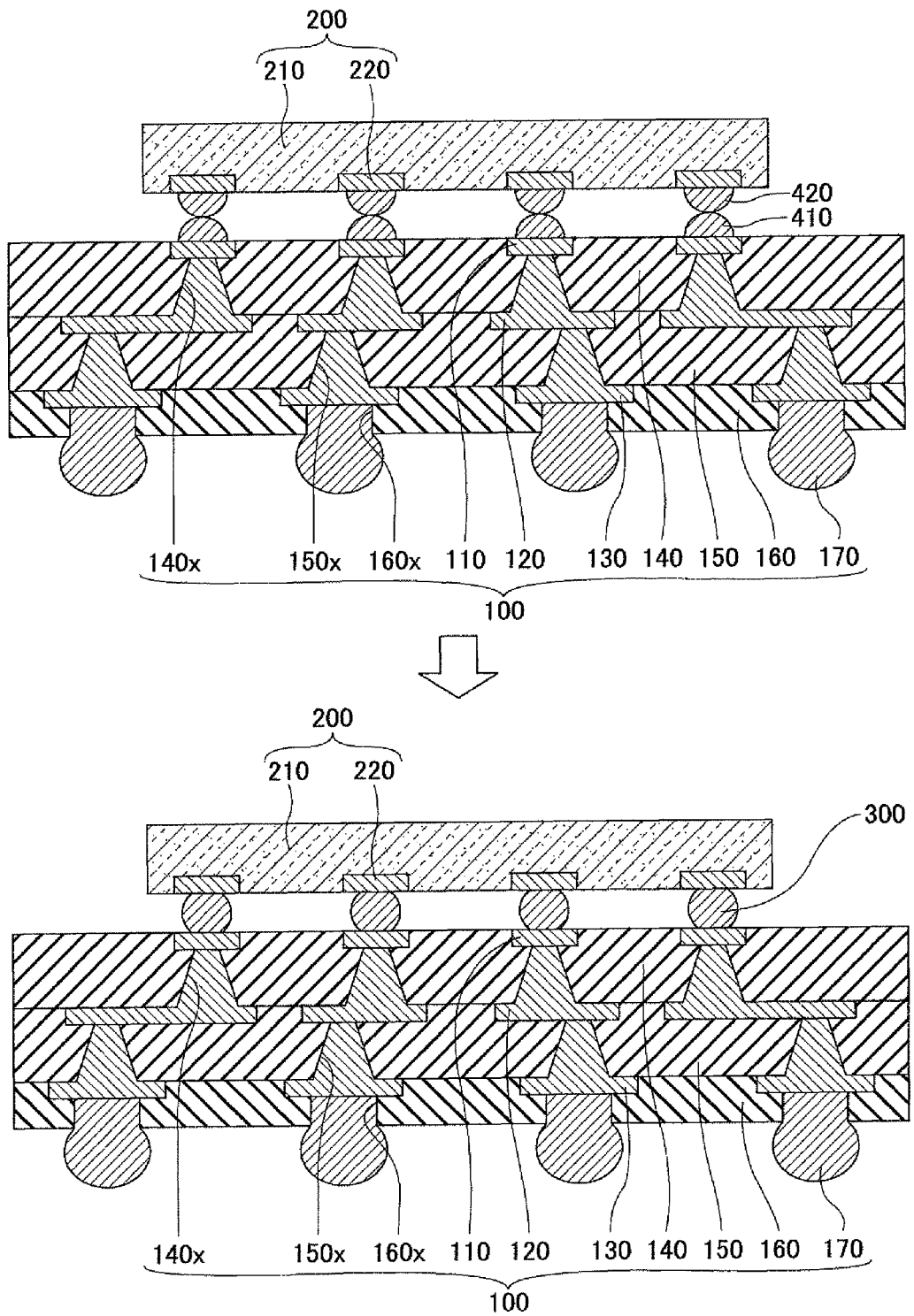
FIG. 3 is a second view of then example of the manufacturing steps of the related art semiconductor package.
Figure 4:
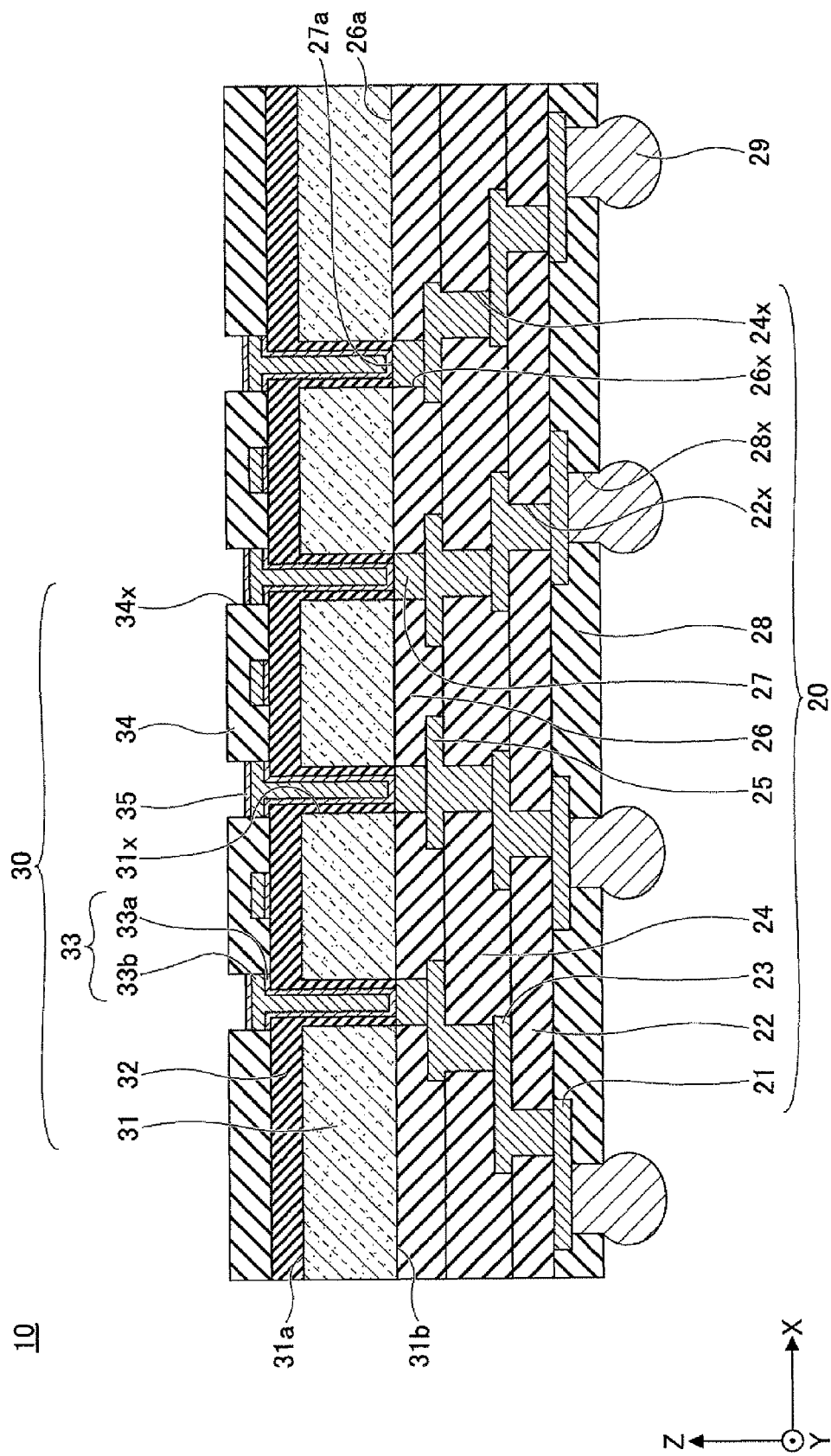
FIG. 4 is a cross-sectional view of an example of a wiring board of a first embodiment of the present invention.

FIG. 4 is a cross-sectional view of an example of a wiring board of a first embodiment of the present invention. As shown in FIG. 4, a wiring board 10 has a structure where a silicon substrate 30 is anodically bonded onto a ceramic substrate 20. External connecting terminals 29 are provided at the ceramic substrate 20. Details of the anodic bonding are discussed below.

The wiring board 10 has, for example, a rectangular-shaped planar configuration whose width (length in an X direction) can be approximately 15 mm and depth (length in a Y direction) can be approximately 15 mm. A thickness (length in a Z direction) of the ceramic substrate 20 can be, for example, approximately 50 μm through approximately 1000 μm. A thickness (length in the Z direction) of the silicon substrate 30 can be, for example, approximately 50 μm through approximately 500 μm. Details of the ceramic substrate 20, the external connecting terminals 29, and the silicon substrate 30 forming the wiring board 10 are discussed.

The ceramic substrate 20 includes a first wiring layer 21, a first ceramic layer 22, a second wiring layer 23, a second ceramic layer 24, a third wiring layer 25, a third ceramic layer 26, electrodes 27, and a solder resist layer 28. In the ceramic substrate 20, the first ceramic layer 22, the second ceramic layer 24, and the third ceramic layer 26 are used as insulation layers. The ceramic substrate 20 is a LTCC (Low Temperature Co-fired Ceramic) multi-layer substrate.

The first wiring layer 21 is formed on one of surfaces of the first ceramic layer 22. As a material of the first wiring layer 21, for example, copper (Cu) can be used. Alternatively, as the material of the first wiring layer 21, silver (Ag), gold (Au), or the like may be used. The thickness of the first wiring layer 21 can be, for example, approximately 5 μm.

As a material of the first ceramic layer 22, for example, a material, where alumina cordierite is added to glass including sodium oxide ($Na_2O$), aluminum oxide ($Al_2O_3$), boron oxide ($B_2O_3$) and silicon dioxide ($SiO_2$), or the like can be used. From the perspective of anodic bonding discussed below, it may be preferable that sodium oxide ($Na_2O$) is included at approximately 3%.

Here, the cordierite is a composition including magnesium oxide (MgO), aluminum oxide ($Al_2O_3$), and silicon dioxide ($SiO_2$). As an example of composition of the cordierite, $2MgO.2Al_2O_3.5SiO_2$ can be used. In addition, the alumina cordierite is made by mixing aluminum oxide ($Al_2O_3$) with the cordierite.

By changing an amount of added alumina cordierite, a CTE (Coefficient of Thermal Expansion) of the first ceramic layer 22 can be adjusted. The technical significance where the CTE of the first ceramic layer 22 is adjusted is discussed below. The thickness of the first ceramic layer 22 can be, for example, approximately 10 μm.

The second wiring layer 23 is formed on another surface of the first ceramic layer 22. The second wiring layer 23 includes via-fill supplied in first via-holes 22x which pierce the first ceramic layer 22 and expose an upper surface of the first wiring layer 21, and a wiring pattern formed on the first ceramic layer 22. The second wiring layer 23 is electrically connected to the first wiring layer 21 exposed in the first via-holes 22x. As a material of the second wiring layer 23, for example, copper (Cu) can be used. Alternatively, as the material of the second wiring layer 23, silver (Ag), gold (Au), or the like may be used. The thickness of the wiring pattern of the second wiring layer 23 can be, for example, approximately 5 μm.

The second ceramic layer 24 is formed on the first ceramic layer 22 so as to cover the second wiring layer 23. As a material of the second ceramic layer 24, for example, a material where alumina cordierite is added to glass including sodium oxide ($Na_2O$), aluminum oxide ($Al_2O_3$), boron oxide ($B_2O_3$), and silicon dioxide ($SiO_2$), or the like can be used. From the perspective of anodic bonding discussed below, it may be preferable that sodium oxide ($Na_2O$) is included at approximately 3%. The thickness of the second ceramic layer 24 can be, for example, approximately 10 μm.

The third wiring layer 25 is formed on the second ceramic layer 24. The third wiring layer 25 includes via-fill supplied in second via-holes 24x which pierce the second ceramic layer 24 and expose an upper surface of the second wiring layer 23, and a wiring pattern of the second ceramic layer 24. The third wiring layer 25 is electrically connected to the second wiring layer 23 exposed in the second via-holes 24x. As a material of the third wiring layer 25, for example, copper (Cu) can be used. Alternatively, as the material of the third wiring layer 25, silver (Ag), gold (Au), or the like may be used. The thickness of the wiring pattern of the third wiring layer 25 can be, for example, approximately 5 μm.

The third ceramic layer 26 is formed on the second ceramic layer 24 so as to cover the third wiring layer 25. As a material of the third ceramic layer 26, for example, a material where alumina cordierite is added to glass including sodium oxide ($Na_2O$), aluminum oxide ($Al_2O_3$), boron oxide ($B_2O_3$), and silicon dioxide ($SiO_2$), or the like can be used. From the perspective of anodic bonding discussed below, it may be preferable that sodium oxide ($Na_2O$) is included at approximately 3%. The thickness of the third ceramic layer 26 can be, for example, approximately 10 μm.

The electrodes 27 include via-fill supplied in third via-holes 26x which pierce the third ceramic layer 26 and expose an upper surface of the third wiring layer 25. The surfaces 27a of the electrodes 27 are substantially flush with a surface 26a of the third ceramic layer 26. In other words, the surfaces 27a of the electrodes 27 are exposed from the surface 26a of the third ceramic layer 26. The electrodes 27 are electrically connected to the third wiring layer 25 exposed in the third via-holes 26x. As a material of the electrodes 27, for example, copper (Cu) can be used. Alternatively, as the material of the electrodes 27, silver (Ag), gold (Au), or the like may be used. The thickness of the wiring pattern forming the electrodes 27 can be, for example, approximately 5 µm.

The solder resist layer 28 is provided on one of the surfaces of the first ceramic layer 22 so as to cover the first wiring layer 21. The solder resist layer 28 includes opening parts 28x so that parts of the first wiring layer 21 are exposed in the opening parts 28x of the solder resist layer 28. As a material of the solder resist layer 28, for example, a photosensitive resin composition including epoxy group resin, imide group resin, or the like can be used. The thickness of the solder resist layer 28 can be, for example, approximately 15 µm.

If necessary, a metal layer or the like may be formed on the first wiring layer 21 exposed in the opening parts 28x. The metal layer may be, for example, an Au layer, a Ni/Au layer where Ni and Au are stacked in this order, or a Ni/Pd/Au layer where Ni, Pd, and Au are stacked in this order.

The outside connection terminals 29 are formed on the first wiring layer 21 exposed in the opening parts 28x of the solder resist layer 28 of the ceramic substrate 20 (on a metal layer or the like in a case where the metal layer or the like is formed on the first wiring layer 21).

In a planar view, the wiring board 10 has a so-called a fan-out structure. In the fan-out structure, a region where the outside connection terminals 29 are formed extends to the periphery of a region where the wiring layer 33 (working as electrode pads to be connected to the semiconductor chip) exposed in opening parts 34x is formed. In other words, the first wiring layer 21 through the third wiring layer 25 are provided so that the outside connection terminals 29 are situated in the periphery of a region where the semiconductor chip is connected.

The pitch of neighboring outside connection terminals 29 can be increased so as to be greater than the pitch (for example, approximately 80 µm) of the electrode pads of the wiring layer 33 exposed in the neighboring opening parts 34x. For example, the pitch of neighboring outside connection terminals 29 can be approximately 400 µm. The wiring board 10, depending on the purpose, may have a fan-in structure.

The outside connection terminals 29 work as terminals electrically connected to pads provided on a mounting board (not illustrated in FIG. 4) such as a motherboard. As the outside connection terminals 29, for example, solder balls or the like can be used. As a material of the solder balls, for example, an alloy including Pb, an alloy of Sn and Cu, an alloy of Sn and Ag, an alloy of Sn, Ag, and Cu, or the like can be used. A lead pin may be used as the outside connection terminal 29.

Although the outside connection terminals 29 are formed in the first embodiment of the present invention, it is not always necessary to form the outside connection terminals 29. In other words, it is sufficient that a part of the first wiring layer 21 be exposed through the solder resist layer 28 so that the outside connection terminals 29 may be formed if necessary.

The silicon substrate 30 includes a substrate main body 31, an insulation layer 32, a wiring layer 33 including a first metal layer 33a and a second metal layer 33b, a guide resist layer 34, and a third metal layer 35.

The substrate main body 31 is made of silicon. The thickness of the substrate main body 31 may be, for example, approximately 50 µm through approximately 500 µm. Via-holes 31x pierce from a surface (main surface) 31a of the substrate main body 31 to a surface (rear surface) 31b of the substrate main body 31 so as to expose the surfaces 27a of the electrodes 27 of the ceramic substrate 20. The pitch of the neighboring via-holes 31x can be properly selected but can be, for example, approximately 80 µm. The via-hole 31x has, for example, a circular-shaped planar configuration (seen from the surface 31a or 31b side of the substrate main body 31) having a diameter of, for example, approximately 10 µm through approximately 200 µm.

The insulation layer 32 is formed on the surface 31a of the substrate main body 31 and inside surfaces of the via-holes 31x. The insulation layer 32 is a film configured to provide insulation between the substrate main body 31 and the wiring layer 33. As a material of the insulation layer 32, insulation resin such as benzocyclobutene (BCB), polybenzoxazole (PBO), or polyimide (PI) can be used. The thickness of the insulation layer 32 can be, for example, approximately 2 µm through approximately 30 µm.

The wiring layer 33 includes the first metal layer 33a and the second metal layer 33b. The wiring layer 33 includes via-fill supplied in the via-holes 31x via the insulation layer 32 and a wiring pattern formed on the surface 31a of the substrate main body 31 via the insulation layer 32. The wiring layer 33 is electrically connected to the electrodes 27 of the ceramic substrate 20. A thin film (not illustrated in FIG. 4) made of silicon dioxide ($SiO_2$) generated by anodic bonding is provided on an interface between the silicon substrate 30 and the ceramic substrate 20 except for the surfaces 27a of the electrodes 27.

Since the wiring layer 33 can be formed on the substrate main body 31 made of silicon by a semiconductor process, a hyperfine via-hole and a hyperfine wiring pattern can be formed. The wiring pattern of the wiring layer 33 can have line/space ratios, for example, equal to approximately 1/1 µm through approximately 10/10 µm. The thickness of the wiring pattern of the wiring layer 33 can be, for example, approximately 1 µm through approximately 10 µm (in the case where the line/space ratio is equal to approximately 1/1 µm through approximately 10/10 µm).

The guide resist layer 34 is formed on the insulation layer 32 formed on the surface 31a of the substrate main body 31 so as to cover the wiring layer 33. The guide resist layer 34 includes opening parts 34x. Parts of the wiring layer 33 are exposed in the opening parts 34x of the guide resist layer 34. The parts of the wiring layer 33 exposed in the opening parts 34x work as electrode pads to be connected to the semiconductor chip. Alternatively, as a material of the guide resist layer 34, insulation resin such as benzocyclobutene (BCB), polybenzoxazole (PBC)), or polyimide (PI) can be used. As a material of the guide resist layer 34, for example, a photosensitive resin composition including epoxy group resin, imide group resin, or the like can be used. The thickness of the guide resist layer 28 can be, for example, approximately 5 µm through approximately 30 µm.

The third metal layer 35 is formed on the wiring layer 33 exposed in the opening parts 34x of the guide resist layer 34. The third metal layer 35 is provided so that connection reliability is improved at the time when the wiring layer 33 exposed in the opening parts 34x is connected to the semiconductor chip. Accordingly, it may not be necessary to provide the third metal layer 35 on the wiring layer 33 covered with the guide resist layer 34. The third metal layer 35 may be, for example, an Au layer, a Ni/Au layer where Ni and Au are stacked in this order, or a Ni/Pd/Au layer where Ni, Pd, and Au are stacked in this order. In addition, solder plating such as SnAg or SnAgCu can be used as the third metal layer 35. However, depending on necessity, it is not necessary to provide the third metal layer 35 on the wiring layer 33 exposed in the opening parts 34x of the guide resist layer 34.

Thus, the wiring board 10 works as an interposer configured to connect the semiconductor chip (not illustrated in FIG. 4) and the mounting board such as the motherboard (not illustrated in FIG. 4). In the meantime, a CTE (coefficient of thermal expansion) of the silicon substrate is approximately 3 ppm/° C. In addition, a CTE of the semiconductor chip to be connected to the silicon substrate is also approximately 3 ppm/° C., in a case where the semiconductor chip is made of silicon. Thus, the CTEs of the semiconductor chip and the silicon substrate are consistent with each other. Therefore, even if heating is applied at the time when the semiconductor chip and the silicon substrate are connected, it is difficult to generate thermal stress, due to a difference of the CTEs between the semiconductor chip and the silicon substrate 30, at the connecting part of the semiconductor chip and the silicon substrate 30. Because of this, it is possible to improve connection reliability of the semiconductor chip and the silicon substrate 30.

On the other hand, a GTE of the mounting board, such as a motherboard mainly made of a resin substrate, to be connected to the ceramic substrate 20, is approximately 18 ppm/° C. As discussed above, since the CTE of the silicon substrate 30 is approximately 3 ppm/° C., it may be preferable that the CTE of the ceramic substrate 20 provided between the silicon substrate 30 and the mounting board such as a motherboard be between approximately 3 ppm/° C. and approximately 18 ppm/° C.

It may be preferable that the CTEs of portions of the ceramic substrate 20 are gradually increased as the portions are away from the silicon substrate 30 and closer to the mounting board such as the motherboard. For example, the CTE of the third ceramic layer 26 closest to the silicon substrate 30 may be between approximately 4 ppm/° C. and approximately 7 ppm/° C.; the GTE of the first ceramic layer 22 closest to the mounting board such as the motherboard may be between approximately 14 ppm/° C. and approximately 17 ppm/° C.; and CTE of the second ceramic layer 24 provided between the first ceramic layer 22 and the third ceramic layer 26 may be between approximately 8 ppm/° C. and approximately 13 ppm/° C. In addition, as discussed above, the CTE of each of the first ceramic layer 22 through the third ceramic layer 26 can be adjusted by changing the added amount of the alumina cordierite.

Thus, the CTEs of portions of the ceramic substrate 20 are gradually increased as the portions are farther from the silicon substrate 30 and closer to the mounting board such as the motherboard, so that the CTEs of the mounting board such as the motherboard and the first ceramic layer 22 closest to the mounting board such as the motherboard are consistent with each other. Therefore, even if heating is applied at the time when the mounting board such as the motherboard and the ceramic substrate 20 are connected, it is difficult to generate thermal stress, due to a difference of the CTEs between the mounting board such as the motherboard and the ceramic substrate 20, at the connecting part of the mounting board such as the motherboard and the ceramic substrate 20. Because of this, it is possible to improve connection reliability of the mounting board such as the motherboard and the ceramic substrate 20.

In addition, because of the same reason, it is difficult to generate thermal stress, due to a difference of the CTEs at the connecting part of the silicon substrate 30 and the ceramic substrate 20 and in the ceramic substrate 20. Because of this, it is possible to improve connection reliability of all of the connecting parts.

[Manufacturing Method of the Wiring Board of the First Embodiment]

Next, a manufacturing method of the wiring board of the first embodiment is discussed with reference to FIG. 5 through FIG. 18. FIG. 5 through FIG. 18 are views of an example of manufacturing steps of the wiring board of the first embodiment of the present invention. In FIG. 5 through FIG. 18, parts that are the same as the parts shown in FIG. 4 are given the same reference numerals, and explanation thereof is omitted.

Figure 5:
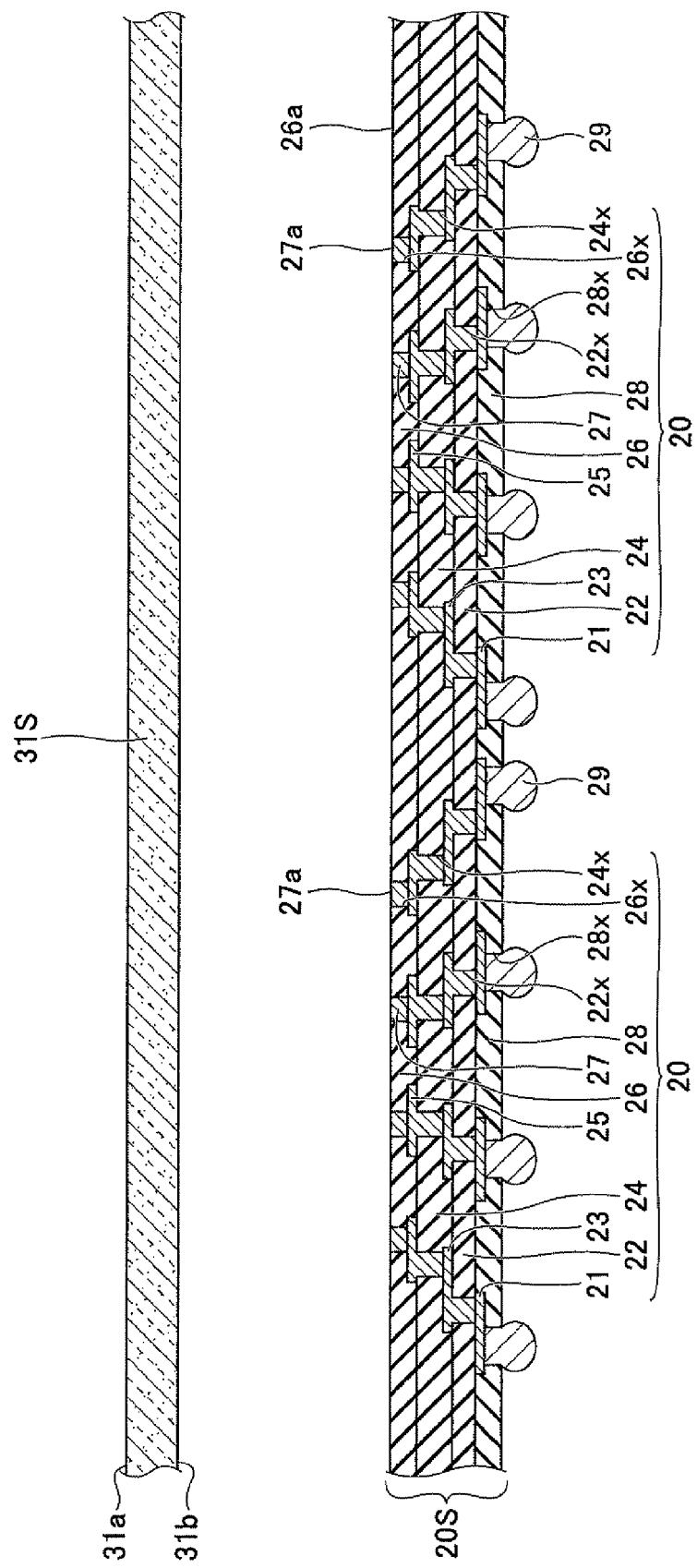
FIG. 5 is a first view of an example of manufacturing steps of the wiring board of the first embodiment of the present invention.

First, in a step illustrated in FIG. 5, a ceramic substrate 20S and a substrate main body 31S are provided. The ceramic substrate 20S includes a plurality of regions which is finally made into pieces so that the ceramic substrates 20 (see FIG. 4) are formed. The ceramic substrate 20S is a LTCC (Low Temperature Co-fired Ceramic) multi-layer substrate. Although the external connecting terminals 29 are formed at the ceramic substrate 20S, it is not always necessary to form the external connecting terminals 25 at this timing. The external connecting terminals 25 may be formed at a necessary timing.

As a material of each of the ceramic layers of the ceramic substrate 20S, for example, a material where alumina cordierite is added to glass including sodium oxide ($Na_2O$), aluminum oxide ($Al_2O_3$), boron oxide ($B_2O_3$), and silicon dioxide ($SiO_2$), or the like can be used. From the perspective of anodic bonding discussed below, it may be preferable that sodium oxide ($Na_2O$) is included at approximately 3%. The ceramic substrate 20S has, for example, a circular-shaped planar configuration having a diameter of, for example, approximately 6 inches (approximately 150 mm), approximately 8 inches (approximately 200 mm), approximately 12 inches (approximately 300 mm), or the like. The thickness of the ceramic substrate 20S can be, for example, approximately 50 μm through approximately 1000 μm.

The ceramic substrate 20S can be manufactured as follows, for example. First, an organic binder and a solvent are added to a material where powder of the alumina cordierite is added to powder of the glass including sodium oxide ($Na_2O$), aluminum oxide ($Al_2O_3$), boron oxide ($B_2O_3$), and silicon dioxide ($SiO_2$). Slurry is made by mixing this material, and then a sheet of the slurry is made by a deposition apparatus. The slurry discharged from the deposition apparatus is applied onto a carrier tape and becomes a green sheet after passing a dry zone. After that, the sheet is cut to a designated size. Next, holes which finally become via-holes are formed in the green sheet. After conductive materials which finally become via-fill and wiring patterns are printed, the green sheets are stacked and sintered so that the ceramic substrate 20S is manufactured.

The substrate main body 31S includes a plurality of regions which is finally made into pieces so that the silicon substrates 30 (see FIG. 4) are formed. As the substrate main body 31S, a thin size silicon wafer having a designated thickness or the like can be used. The silicon wafer has, for example, a circular-shaped planar configuration having a diameter of, for example, approximately 6 inches (approximately 150 mm), approximately 8 inches (approximately 200 mm), approximately 12 inches (approximately 300 mm), or the like. The thickness of the substrate main body 31S can be, for example, approximately 50 μm through approximately 500 μm. The planar configuration of the ceramic substrate 20S and the substrate main body 31S may be or may not be circular-shaped. The planar configuration of the ceramic substrates 20S and the substrate main body 31S may be, for example, rectangular shape.

Figure 6:
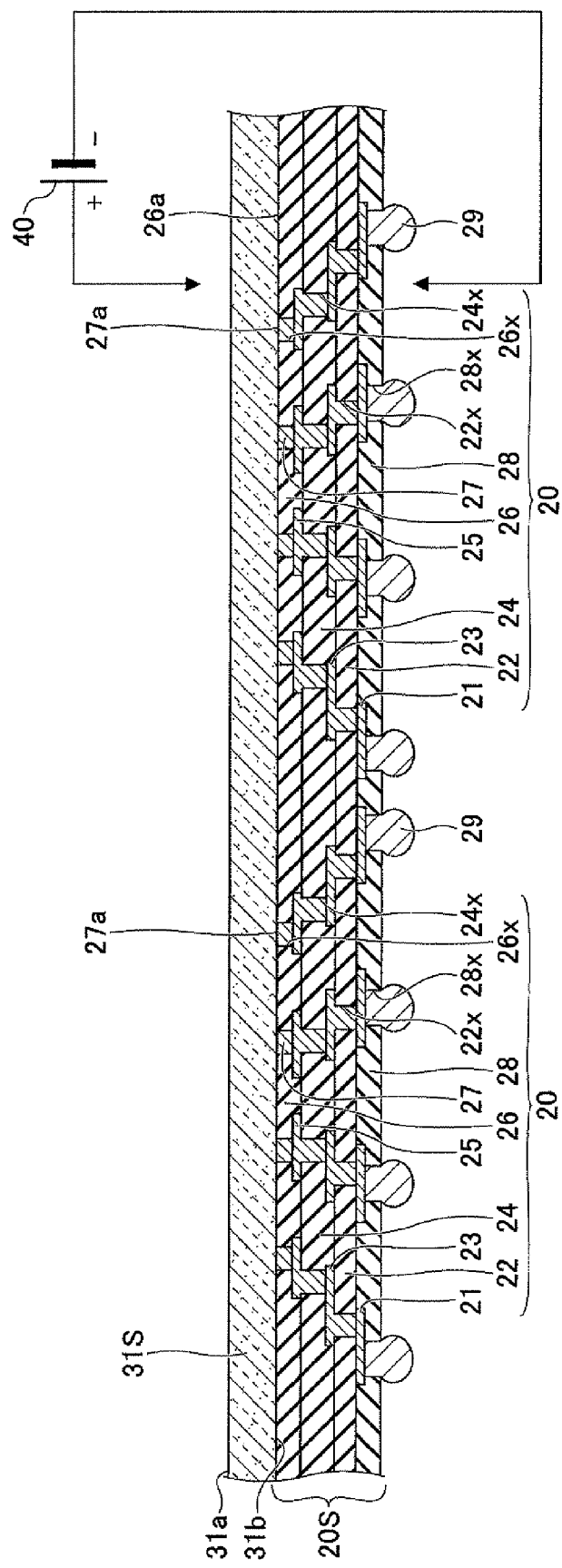
FIG. 6 is a second view of the example of the manufacturing steps of the wiring board of the first embodiment of the present invention.

Next, in a step illustrated in FIG. 6, the surface 26a (first surface) of the ceramic substrate 20S and the surface 31b (rear surface) of the substrate main body 31S are adhered to each other by anodic bonding. More specifically, the ceramic substrate 20S and substrate main body 31S come in contact with each other under a high temperature atmosphere such as at approximately 250° C. through approximately 400° C. Then, from a direct current electric power source 40, a high voltage such as a voltage between approximately 500 V and approximately 1000 V is applied between the ceramic substrate 20S and the substrate main body 31S, so that the substrate main body 31S has a higher electric potential than the ceramic substrate 20S.

As a result of this, sodium oxide ($Na_2O$) included in the ceramic substrate 20S is ionized to $Na^+$ and $O^{2-}$. $Na^+$ moves in the ceramic substrate 20S to a "−" side of the direct current electric power source 40. $O^{2-}$ moves in the ceramic substrate 20S to the substrate main body 31S side. On the other hand, silicon (Si) included in the substrate main body 31S becomes $Si^{4+}$ having a positive electric potential so as to move in the substrate main body 31S to the ceramic substrate 20S side.

As a result of this, electrostatic attraction is generated between the ceramic substrate 20S and the substrate main body 31S. $Si^{4+}$ having a positive electric potential of the substrate main body 31S and $O^{2-}$ having a negative electric potential of the ceramic substrate 20S are chemically connected at the interface between the ceramic substrate 20S and the substrate main body 31S, and thereby the ceramic substrate 20S and the substrate main body 31S are adhered to each other. A thin film (not illustrated) made of silicon dioxide ($SiO_2$) is provided on an interface between the substrate main body 31S and the ceramic substrate 20S.

In order to perform the anodic bonding, it is necessary for the ceramic substrate 20S to include sodium oxide ($Na_2O$). It may be preferable that sodium oxide ($Na_2O$) is included at approximately 3%.

Figure 7:
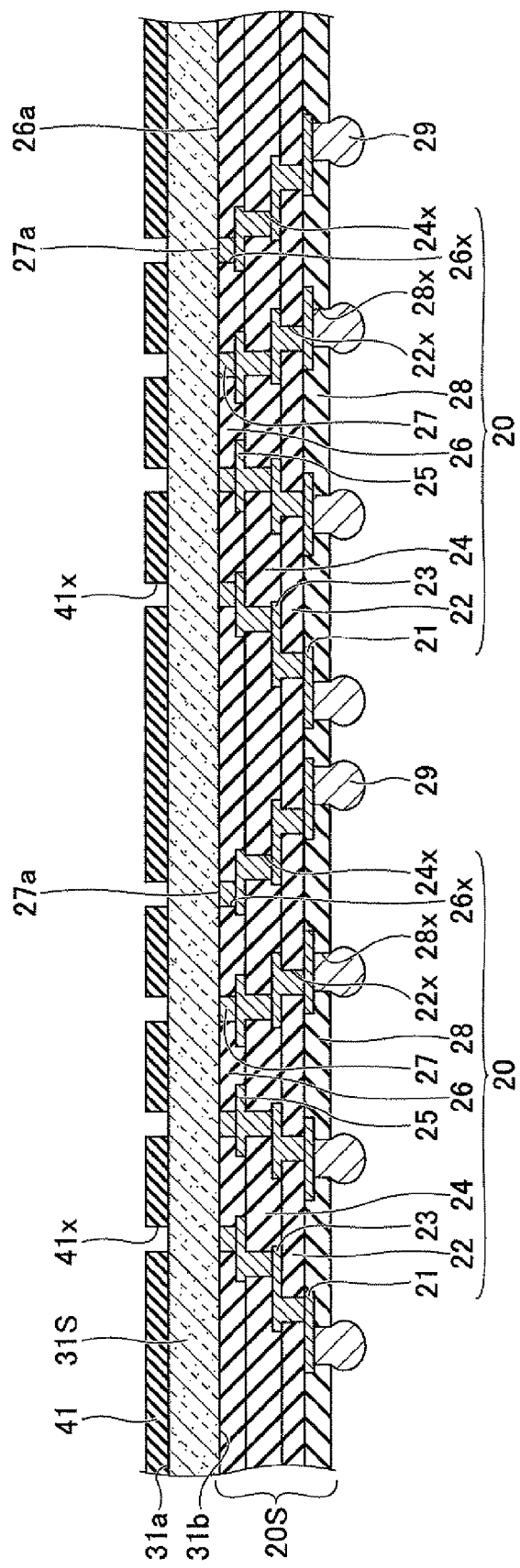
FIG. 7 is a third view of the example of the manufacturing steps of the wiring board of the first embodiment of the present invention.

Next, in a step illustrated in FIG. 7, the resist layer 41 having the opening parts 41x corresponding to the electrodes 27 of the ceramic substrate 20S is formed on the surface 31a of the substrate main body 31S. More specifically, liquid or paste resist made of photosensitive resin composition including, for example, epoxy group resin or imide group resin is applied on the surface 31a of the substrate main body 31S. Alternatively, film resist made of photosensitive resin composition including, for example, epoxy group resin or imide group resin is laminated on the surface 31a of the substrate main body 31S. By exposing and developing the applied or laminated resist, the opening parts 41x are formed. As a result of this, the resist layer 41 having the opening parts 41x is formed. A film resist where the opening parts 41x are formed in advance may be laminated on the surface 31a of the substrate main body 31S. The opening parts 41x are formed in positions corresponding to the electrodes 27. The pitch of the neighboring opening parts 41x may be, for example, approximately 80 µm. The opening part 41x has, for example, a circular-shaped planar configuration (seen from the surface 31a (main surface) or 31b (rear surface) side of the substrate main body 31) having a diameter of, for example, approximately 10 µm through approximately 200 µm.

Figure 8:
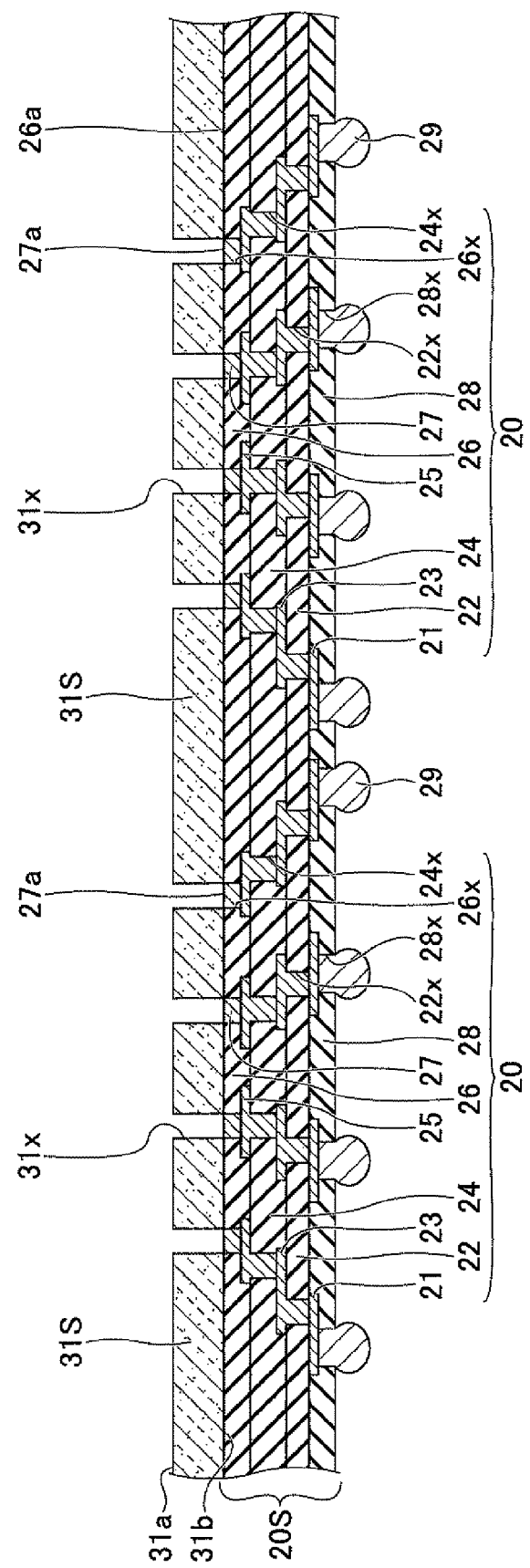
FIG. 8 is a fourth view of the example of the manufacturing steps of the wiring board of the first embodiment of the present invention.

Next, in a step illustrated in FIG. 8, the via-holes 31x exposing the surfaces 27a of the electrodes 27 are formed by etching the substrate main body 31S by using the resist layer 41 illustrated in FIG. 7 as a mask. Then, the resist layer 41 illustrated in FIG. 7 is removed. The via-holes 31x can be formed by an anisotropic etching method such as the DRIE (Deep Reactive Ion Etching) method using, for example, $SF_6$. The pitch of the neighboring via-holes 31x corresponds to the pitch of the opening parts 41x and can be, for example, approximately 80 µm. The via-hole 31x has, for example, a circular-shaped planar configuration (seen from the surface 31a or 31b side of the substrate main body 31) having a diameter of, for example, approximately 10 µm through approximately 200 µm, corresponding to the diameter of the opening part 41x.

Figure 9:
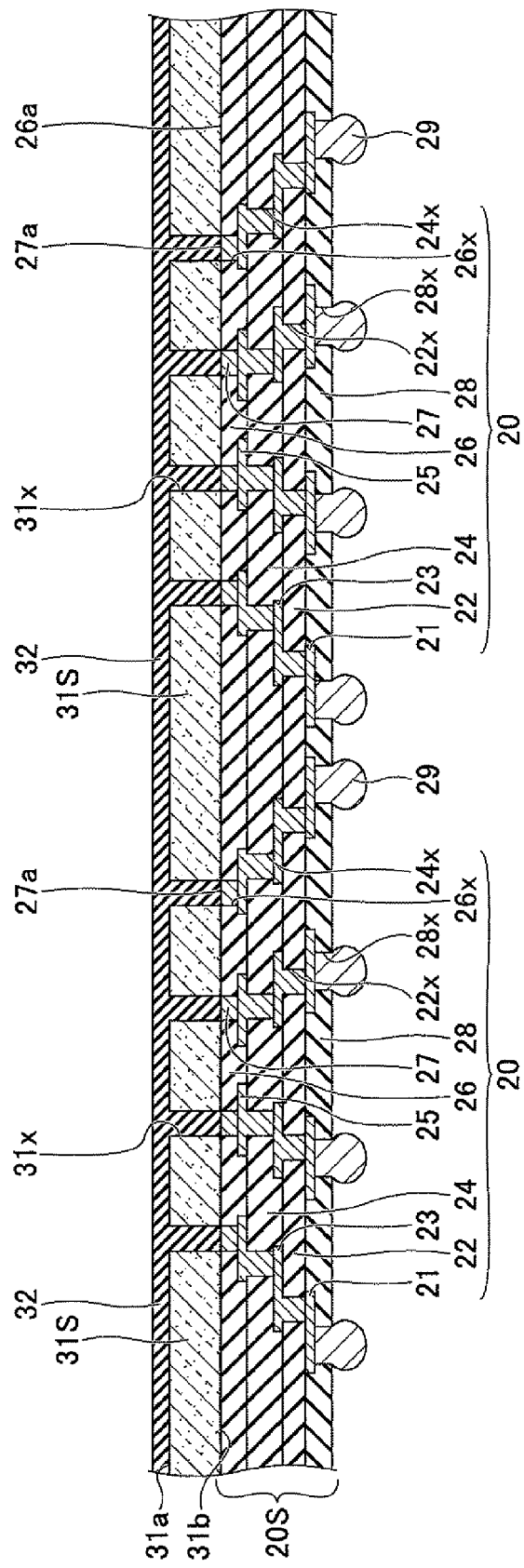
FIG. 9 is a fifth view of the example of the manufacturing steps of the wiring board of the first embodiment of the present invention.

Next, in a step illustrated in FIG. 9, the insulation layer 32 is formed on the surface 31a of the substrate main body 31 and inside surfaces of the via-holes 31x. As a material of the insulation layer 32, insulation resin such as benzocyclobutene (BOB), polybenzoxazole (PBO), or polyimide (PI) can be used. The insulation layer 32 can be formed by, for example, a spin coating method. The thickness of the insulation layer 32 can be, for example, approximately 2 µm through approximately 30 µm.

Figure 10:
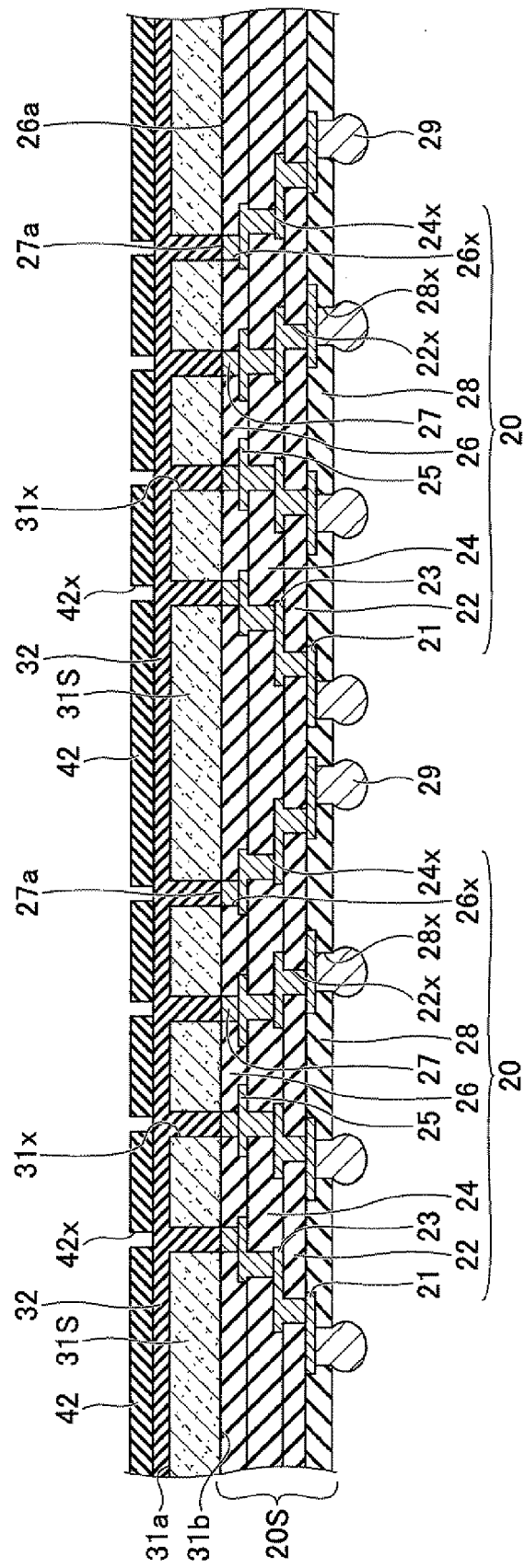
FIG. 10 is a sixth view of the example of the manufacturing steps of the wiring board of the first embodiment of the present invention.

Next, in a step illustrated in FIG. 10, the resist layer 42 is formed on the insulation layer 32. The resist layer 42 has opening parts 42x having diameters slightly smaller than those of the via-holes 31x, the opening parts 42x being situated in positions corresponding to the via-holes 31x. More specifically, liquid or paste resist made of a photosensitive resin composition including, for example, epoxy group resin or imide group resin is applied on the insulation layer 32. Alternatively, film resist made of photosensitive resin composition including, for example, epoxy group resin or imide group resin is laminated on the insulation layer 32. By exposing and developing the applied or laminated resist, the opening parts 42x are formed. As a result of this, the resist layer 42 having the opening parts 42x is formed. A film resist where the opening parts 42x are formed in advance may be laminated on the surface 31a of the substrate main body 31S. The reason why the diameter of the opening part 42x is slightly smaller than that of the via-hole 31x is to cover the inside surface of the via-hole 31x with the insulation layer 32 and to prevent the silicon forming the substrate main body 31S from being exposed in a step illustrated in FIG. 11.

Figure 11:
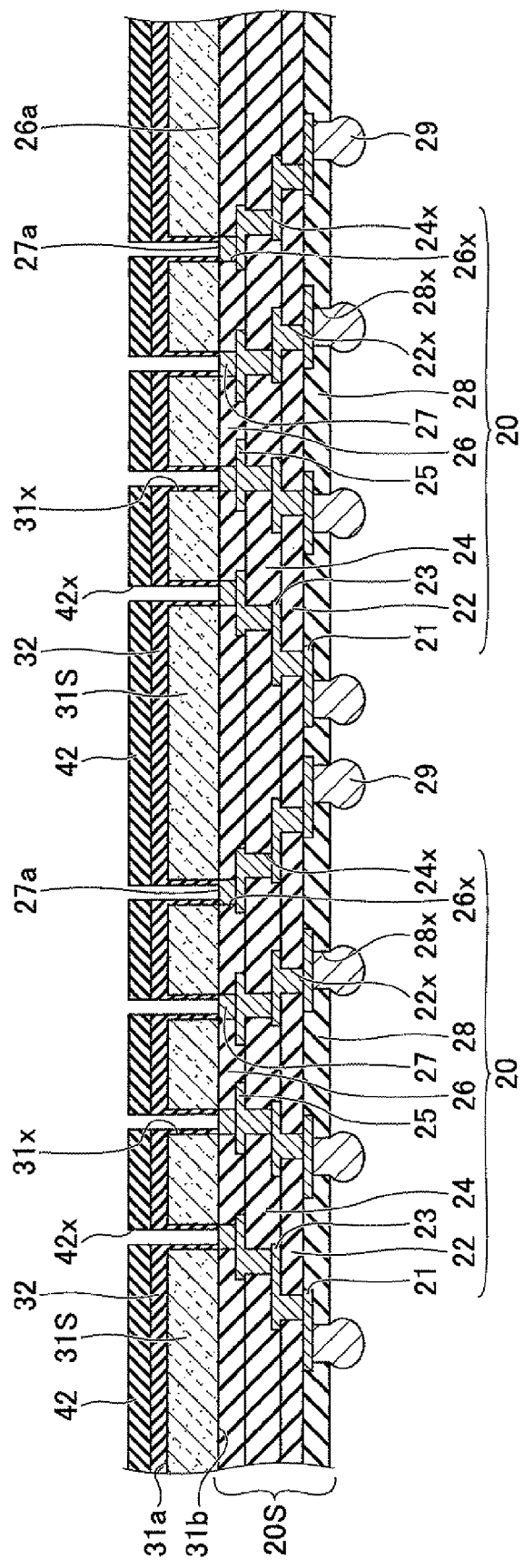
FIG. 11 is a seventh view of the example of the manufacturing steps of the wiring board of the first embodiment of the present invention.

Next, in the step illustrated in FIG. 11, the insulation layer 32 is etched by using the resist layer 42 as a mask, so that the insulation layer 32 in the via-holes 31 is removed, while the insulation layer 32 covering the inside surfaces of the via-holes 31x remains. As a result of this, the surface 27a of the electrode 27 is exposed in the via-hole 31x. After that, the resist layer 42 is removed. The thickness of the insulation layer 32 covering the inside surfaces of the via-holes 31x can be, for example, approximately 5 µm.

Figure 12:
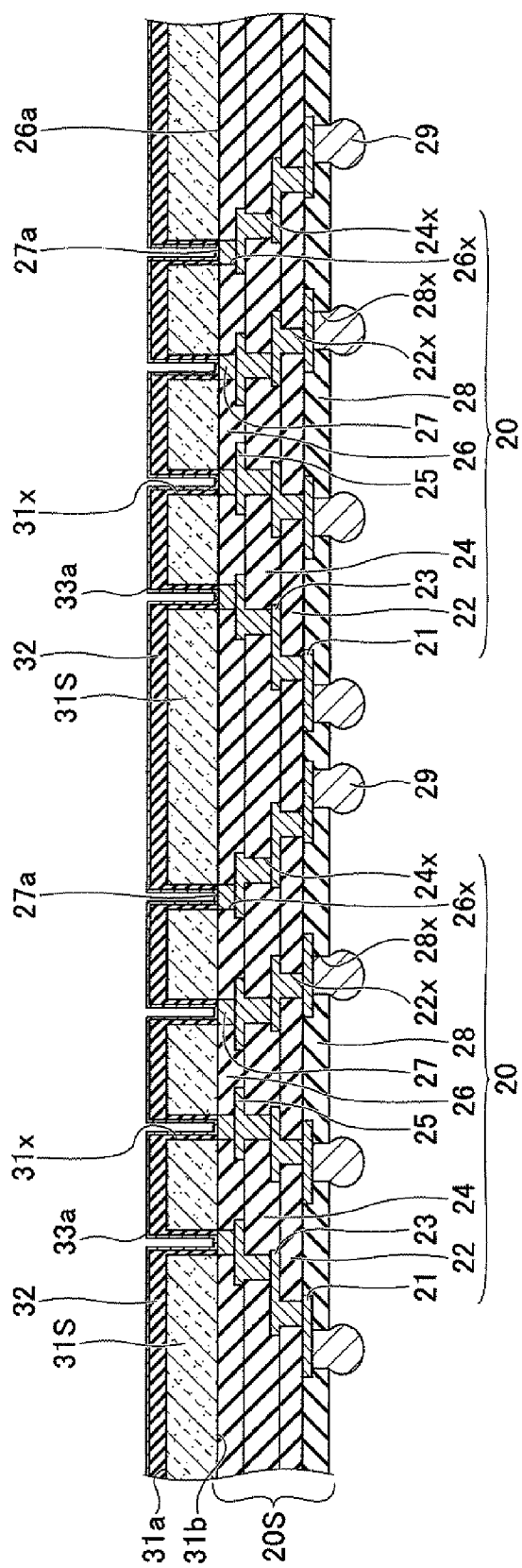
FIG. 12 is an eighth view of the example of the manufacturing steps of the wiring board of the first embodiment of the present invention.

Next, in a step illustrated in FIG. 12, the first metal layer 33a is formed on the surfaces 27a of the electrodes 27 exposed in the via-holes 31x and on the insulation layer 32 (including the insulation layer 32 covering the inside surfaces of the via-holes 31x). The first metal layer 33a can be formed by, for example, a sputtering method. As the first metal layer 33a, for example, a Ti/Cu layer where Ti and Cu are stacked in this order, a Cr/Cu layer where Cr and Cu are stacked in this order, or the like can be used. In this case, the thickness of the Ti layer can be approximately 0.1 µm through approximately 0.2 µm; the thickness of the Cr layer can be approximately 0.05 µm through approximately 0.1 µm; and the thickness of the Cu layer can be approximately 0.1 µm through approximately 0.5 µm.

Figure 13:
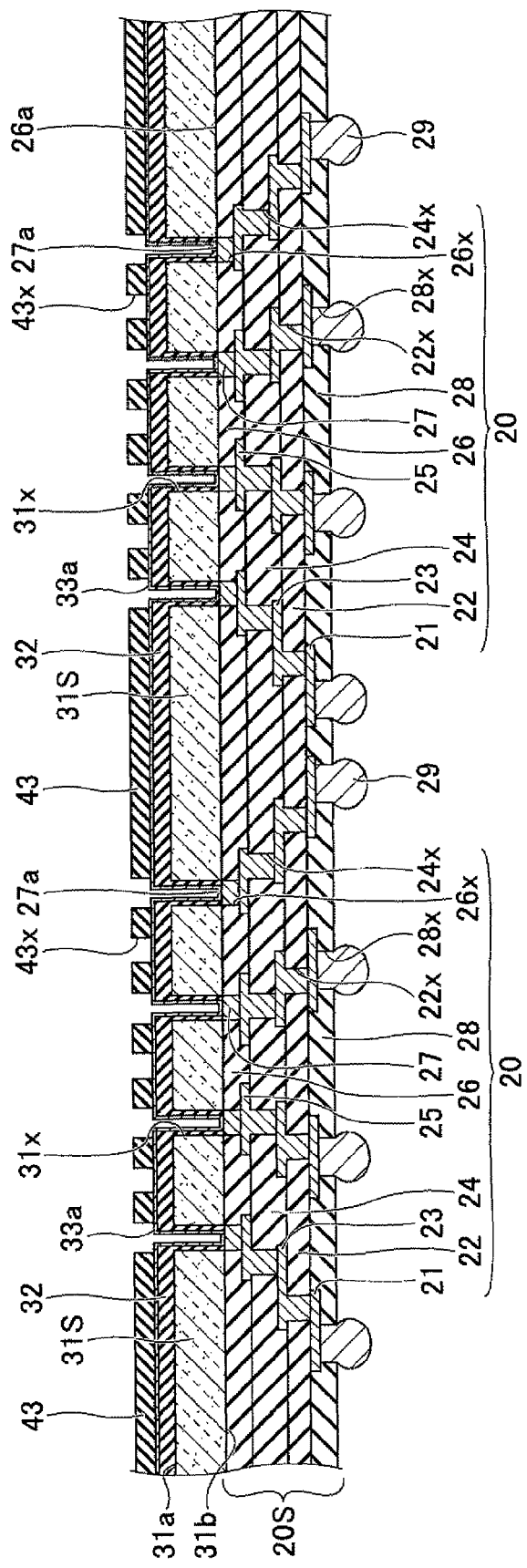
FIG. 13 is a ninth view of the example of the manufacturing steps of the wiring board of the first embodiment of the present invention.

Next, in a step illustrated in FIG. 13, the resist layer 43 having the opening parts 43x is formed on the first metal layer 33a. More specifically, liquid state or paste state resist made of photosensitive resin composition including, for example, epoxy group resin or imide group resin is applied on the first metal layer 33a. Alternatively, film state resist made of photosensitive resin composition including, for example, epoxy group resin or imide group resin is laminated on the first metal layer 33a. By exposing and developing the applied or laminated resist, the opening parts 43x are formed. As a result of this, the resist layer 43 having the opening parts 43x is formed. A film resist where the opening parts 43x are formed in advance may be laminated on the first metal layer 33a.

Figure 14:
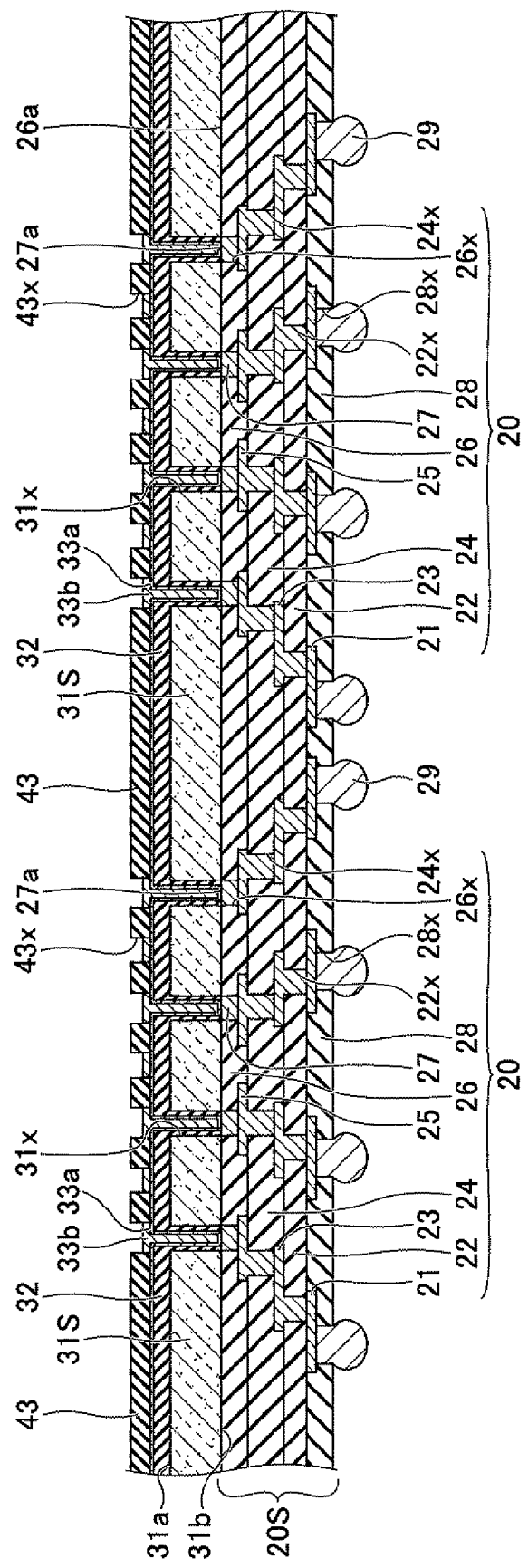
FIG. 14 is a tenth view of the example of the manufacturing steps of the wiring board of the first embodiment of the present invention.

Next, in a step illustrated in FIG. 14, the second metal layer 33b is formed on the first metal layer 33a exposed in the opening parts 43x. The second metal layer 33b can be formed by, for example, the electrolytic plating method where the first metal layer 33a is used as a feeding layer. As the second metal layer 33b, for example, a Cu layer or the like can be used.

Figure 15:
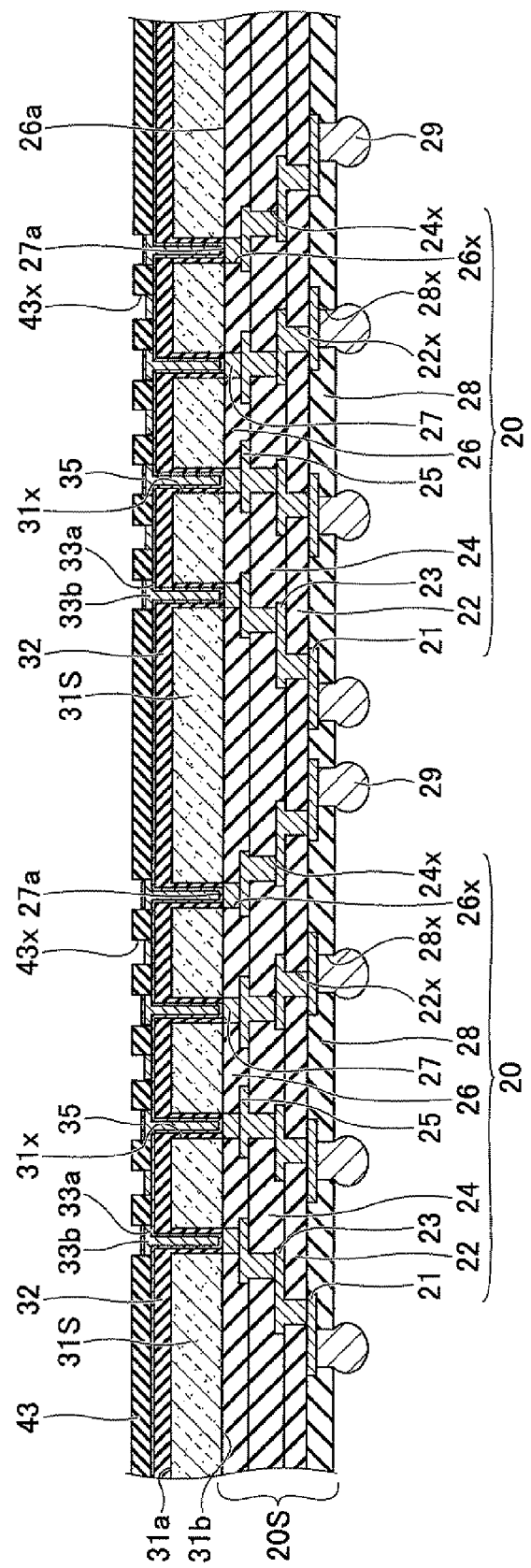
FIG. 15 is a eleventh view of the example of the manufacturing steps of the wiring board of the first embodiment of the present invention.

Next, in a step illustrated in FIG. 15, the third metal layer 35 is formed on the second metal layer 33b. The third metal layer 35 can be formed by, for example, the electrolytic plating method where the first metal layer 33a is used as a feeding layer. The third metal layer 35 may be, for example, an Au layer, a Ni/Au layer where Ni and Au are stacked in this order, or a Ni/Pd/Au layer where Ni, Pd, and Au are stacked in this order. In addition, solder plating such as SnAg or SnAgCu can be used as the third metal layer 35. However, depending on necessity, it is not necessary to provide the third metal layer 35. The thickness of the third metal layer 35 can be, for example, approximately 0.5 μm through approximately 5 μm.

The third metal layer 35 is provided so that connection reliability at the time when the wiring layer 33 is connected to the semiconductor chip is improved. Because of this, it is not necessary to form the third metal layer 35 on a portion not finally exposed from the guide resist layer 34. Therefore, it may be possible to mask a portion of the wiring layer 33 not finally exposed from the guide resist layer 34 and then to form the third metal layer 35, so that the cost of material such as Au forming the third metal layer 35 can be reduced.

Figure 16:
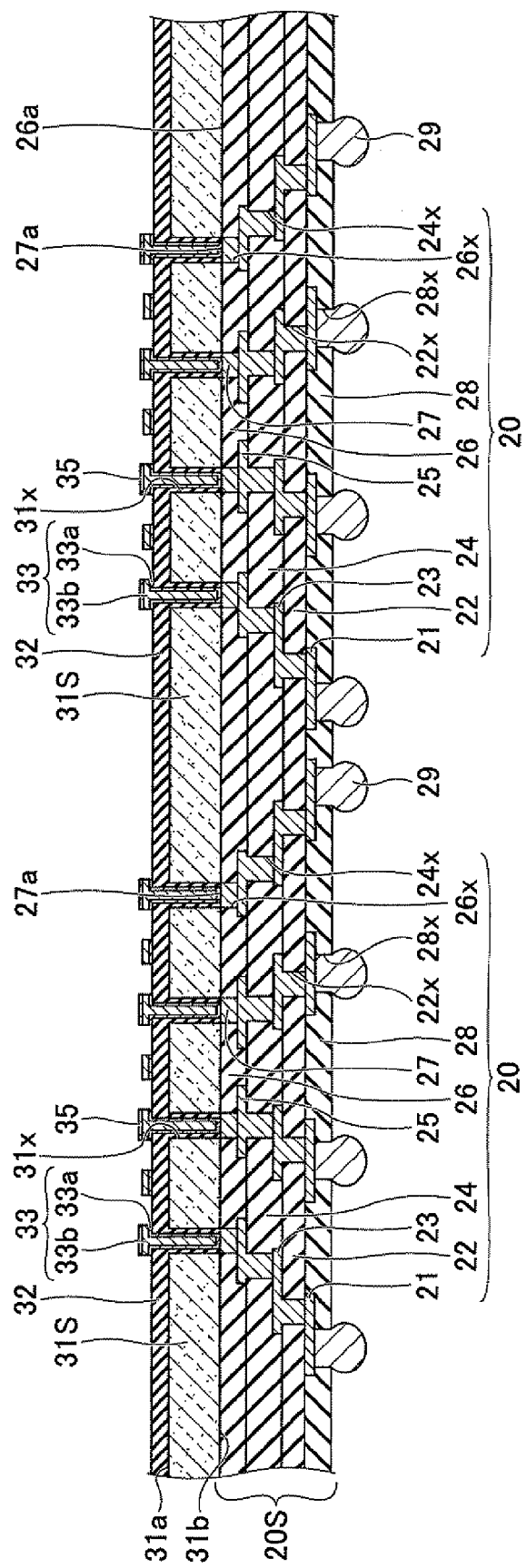
FIG. 16 is a twelfth view of the example of the manufacturing steps of the wiring board of the first embodiment of the present invention.

Next, in a step illustrated in FIG. 16, after the resist layer 43 illustrated in FIG. 15 is removed, a portion of the first metal layer 33a not covered with the second metal layer 33b is etched by using the second metal layer 33b as a mask so as to be removed. As a result of this, the wiring layer 33 having the following structure is formed. That is, the wiring layer 33 includes the first metal layer 33a and the second metal layer 32b. The wiring layer 33 includes via-fill supplied in the via-holes 31x via the insulation layer 32 and a wiring pattern formed on the surface 31a of the substrate main body 31 via the insulation layer 32.

The wiring pattern of the wiring layer 33 can have a line/space ratio, for example, equal to approximately 1/1 μm through approximately 10/10 μm. The thickness of the wiring pattern of the wiring layer 33 can be, for example, approximately 1 μm through approximately 10 μm (in the case where the line/space ratio is equal to approximately 1/1 μm through approximately 10/10 μm). Thus, the wiring layer 33 can be formed by a semi-additive method. The wiring layer 33 may be formed by various kinds of wiring forming methods such as a subtractive method, in addition to the semi-additive method.

The silicon substrate 30 includes only the wiring layer 33 and does not have a multi-layer structure. Therefore, it is possible to inhibit increase of the equipment cost and to manufacture the wiring board at high yield rate. Hence, it is possible to reduce the manufacturing cost.

Figure 17:
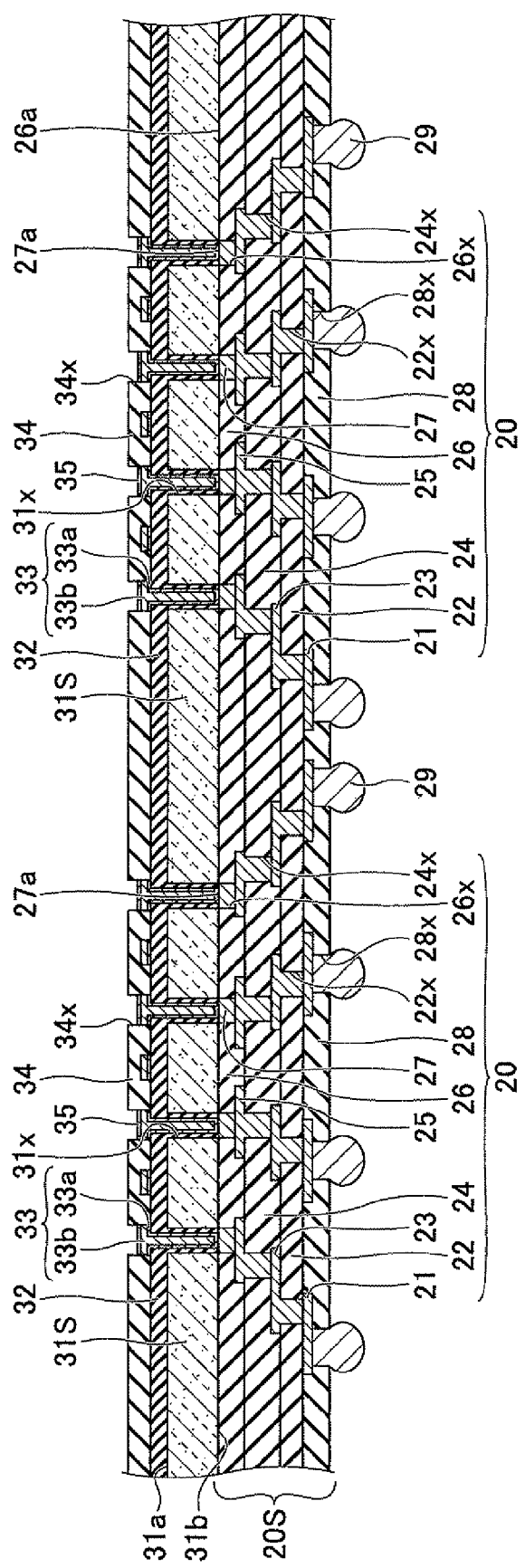
FIG. 17 is a thirteenth view of the example of the manufacturing steps of the wiring board of the first embodiment of the present invention.

Next, in a step illustrated in FIG. 17, the guide resist layer 34 is formed on the insulation layer 32 formed on the surface 31a of the substrate main body 31 so as to cover the wiring layer 33. The guide resist layer 34 includes the opening parts 34x. More specifically, for example, the mask is provided on the third metal layer 35 and the insulation resin, such as benzocyclobutene (BCB), polybenzoxazole (PBO), or polyimide (PI), is applied on the insulation layer 32 formed on the surface 31a of the substrate main body 31S by a spin coating method so as to be cured. The opening parts 34x are formed by removing the mask. As a result of this, the guide resist layer 34 having the opening parts 34x is formed. The third metal layer 35 is exposed in the opening parts 34x of the guide resist layer 34. The thickness of the guide resist layer 34 can be, for example, approximately 2 μm through approximately 30 μm.

As a material of the guide resist layer 34, for example, a photosensitive resin composition including epoxy group resin, imide group resin, or the like can be used. In this case, the solder resist made of the photosensitive resin composition including epoxy group resin, imide group resin, or the like is applied on the insulation layer 32 formed on the surface 31a of the substrate main body 31S so as to cover the wiring layer 33 and the third metal layer 35. Then, by exposing and developing the applied resist, the opening parts 34x are formed. As a result of this, the resist layer 34 having the opening parts 34x is formed.

Figure 18:
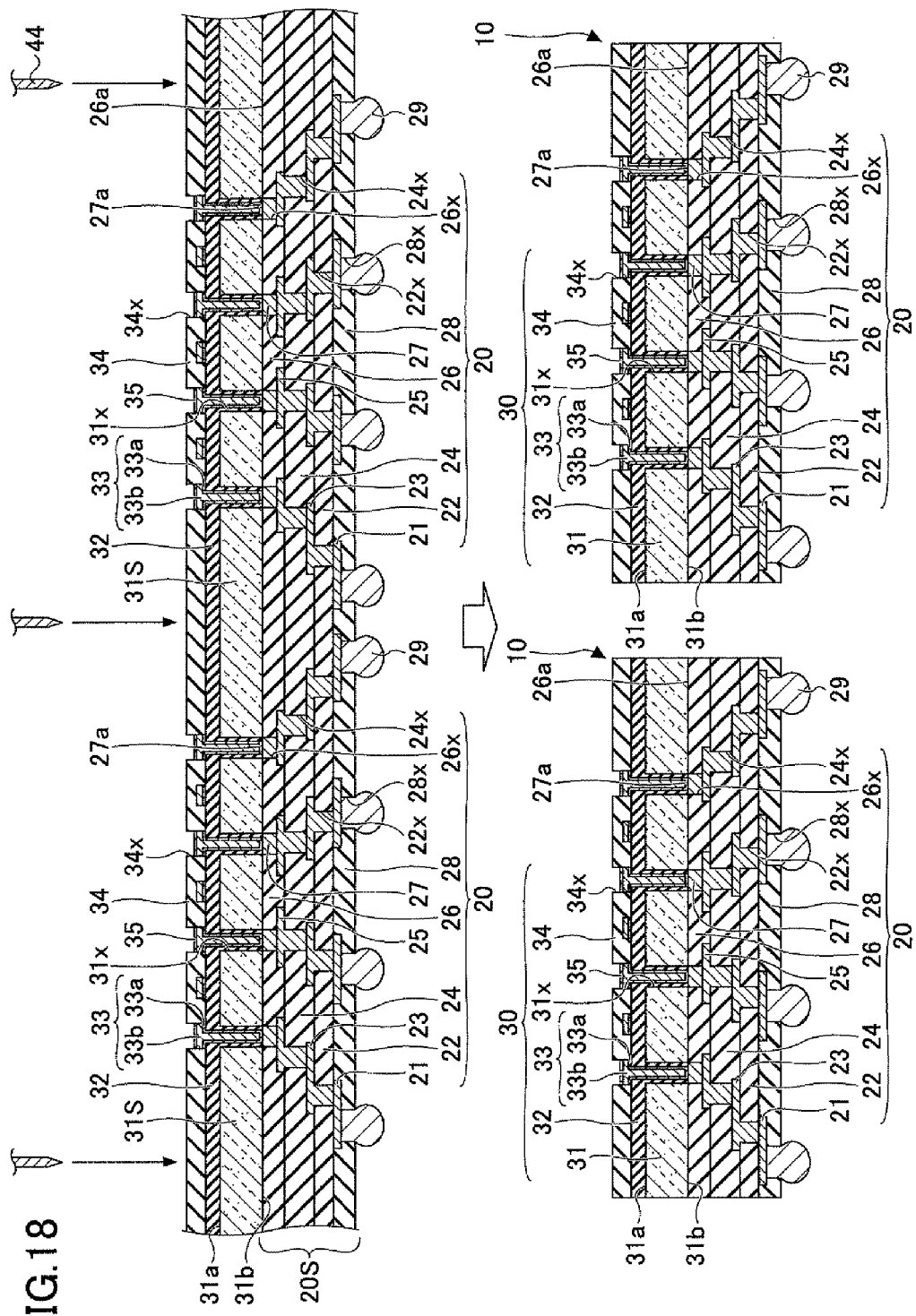
FIG. 18 is a fourteenth view of the example of the manufacturing steps of the wiring board of the first embodiment of the present invention.

Next, in a step illustrated in FIG. 18, a structural body illustrated in FIG. 17 is cut in designated positions so that the wiring board 10 illustrated in FIG. 4 and including the ceramic substrate 20 and the silicon substrate 30 is completed. The structural body illustrated in FIG. 17 can be cut by dicing using the dicing blade 44 or the like. Here, "the designated positions" means positions for boundaries of plural areas for the ceramic substrates 20 of the ceramic substrate 20S and corresponding positions of the substrate main body 31S. The substrate main body 31S is cut so that the substrate main bodies 31 are formed.

As discussed above, according to the first embodiment of the present invention, the ceramic substrate and the silicon substrate are provided. The ceramic substrate includes stacked plural ceramic layers and an internal wiring. An electrode electrically connected to the internal wiring is exposed from one surface of the ceramic substrate. A rear surface of the substrate main body is anodically bonded to the one of the surfaces (first surface) of the ceramic substrate. A via-hole configured to expose the electrode of the ceramic substrate is formed in the substrate main body. In addition, an insulation layer is formed on a main surface of the substrate main body and an internal surface of the via-hole. Furthermore, a wiring layer including a via-fill and a wiring pattern formed on the main surface and electrically connected to the via-fill is formed so that the silicon substrate is completed. The via-fill is supplied in the via-hole where the insulation layer is formed. The via-fill is electrically connected to an electrode of the ceramic substrate. After that, the manufactured structural body is cut so as to make pieces and thereby the wiring board including the ceramic substrate and the silicon substrate is completed.

As a result of this, it is possible to realize a wiring board having specific features of the silicon substrate where hyperfine via-holes and hyperfine wiring patterns can be formed and specific features of the ceramic substrate where good rigidity and thermal conductivity are provided, manufacturing cost is low, and a multilayer structure can be formed.

In addition, the silicon substrate includes only the wiring layer and does not have a multi-layer structure. Therefore, it is possible to inhibit increase of the equipment cost and to manufacture the wiring board at high yield rate. Hence, it is possible to reduce the cost for manufacturing the wiring board including the silicon substrate and the ceramic substrate. Accordingly, by making this wiring board as an interposer for connecting the semiconductor chip and the mounting board such as the motherboard, it is possible to realize the interposer which can correspond to a fine structure of the semiconductor chip at low cost.

Furthermore, it is possible to easily connect the silicon substrate and the ceramic by using anodic bonding.

By changing an amount of added alumina cordierite, a CTE of each of the ceramic layers forming the ceramic substrate can be adjusted. As a result of this, the CTE of the ceramic layer close to the silicon substrate can be close to the CTE of the silicon substrate. The CTE of the ceramic layer far from the silicon substrate can be close to the CTE of the mounting board such as the motherboard by making the CTE of the ceramic layer far from the silicon substrate greater than the CTE of the ceramic layer close to the silicon substrate.

As a result of this, it is difficult to generate thermal stress, due to differences of the CTEs, at the connecting part of the silicon substrate and the ceramic substrate, the connecting part of the ceramic substrate and each of the wiring layers, and the connecting part of the ceramic substrate and the mounting board such as the motherboard. Therefore, it is possible to improve connection reliability of all of the connecting parts when the wiring board of the first embodiment works as an interposer between the semiconductor chip and the mounting board such as the motherboard.

In addition, when the semiconductor package where the semiconductor chip is mounted on the wiring board of the first embodiment is manufactured, the semiconductor chip is mounted on the silicon substrate. Since the CTEs of the semiconductor chip and the silicon substrate are substantially equal to each other in the case where the semiconductor chip is made of silicon, it is difficult to generate the thermal stress due to the difference of the CTEs at the connecting part of the semiconductor chip and the silicon substrate. As a result of this, since it is possible to sufficiently secure the connecting reliability of the semiconductor chip and the silicon substrate, it may not be necessary to supply the underfill resin between the semiconductor chip and the silicon substrate when the semiconductor package is manufactured.

(Second Embodiment)
[Structure of Wiring Board of the Second Embodiment]

Figure 19:
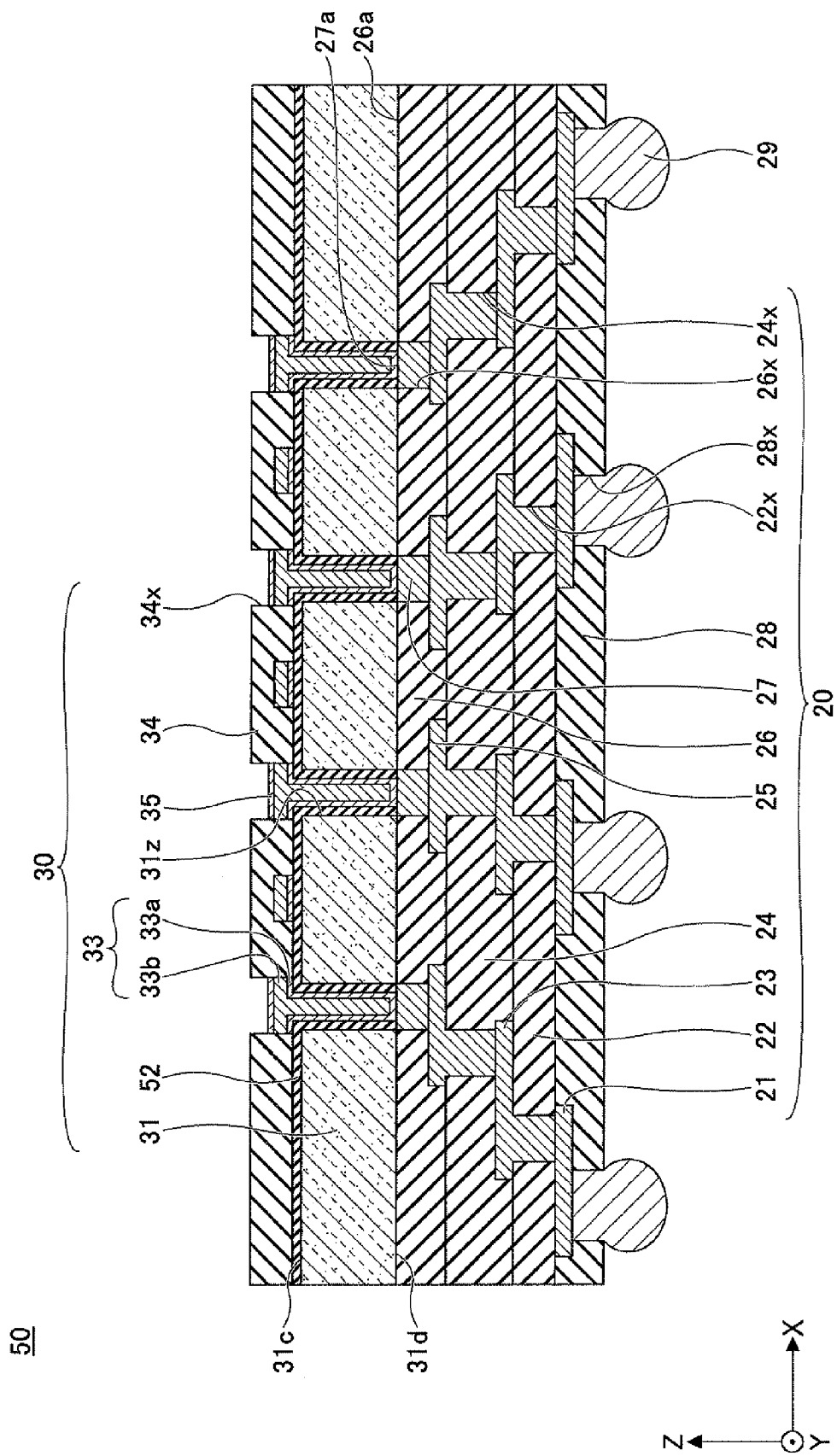
FIG. 19 is a cross-sectional view of an example of a wiring board of a second embodiment of the present invention.

FIG. 19 is a cross-sectional view of an example of a wiring board of a second embodiment of the present invention;

As shown in FIG. 19, a wiring board 50 is different from the wiring board 10 in that the insulation layer 32 of the wiring board 10 is replaced with an insulation layer 52. In the wiring board 50, parts that are the same as the parts of the wiring board 10 are given the same reference numerals, and explanation thereof is omitted.

The insulation layer 52 is formed on the surface 31c of the substrate main body 31 and an inside surface of the via-holes 31z. The insulation layer 52 is a film configured to provide insulation between the substrate main body 31 and the wiring layer 33. As a material of the insulation layer 52, for example, silicon dioxide ($SiO_2$) can be used. The thickness of the insulation layer 52 can be, for example, approximately 1 μm through approximately 2 μm.

[Manufacturing Method of the Wiring Board of the Second Embodiment]

Next, a manufacturing method of the wiring board of the second embodiment is discussed with reference to FIG. 20 through FIG. 25. FIG. 20 through FIG. 25 are views of an example of manufacturing steps of the wiring board 50 of the second embodiment of the present invention. In FIG. 20 through FIG. 25, parts that are the same as the parts shown in FIG. 19 are given the same reference numerals, and explanation thereof is omitted.

Figure 20:
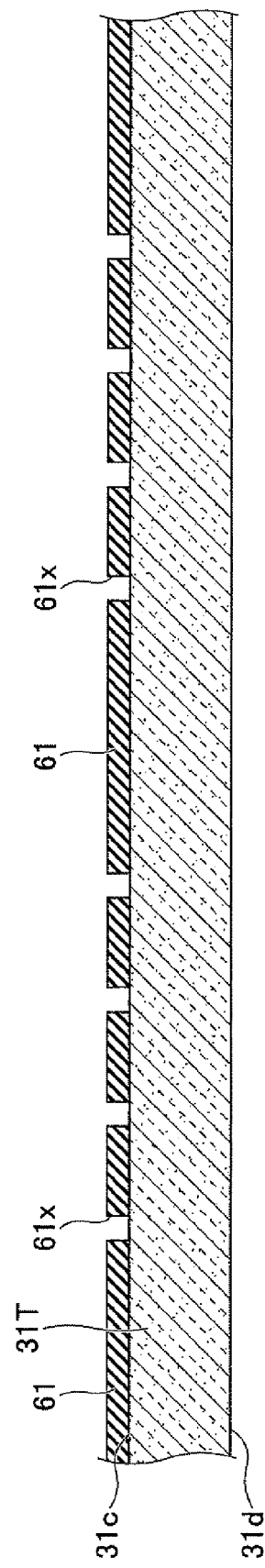
FIG. 20 is a first view of an example of manufacturing steps of the wiring board of the second embodiment of the present invention.

First, in a step illustrated in FIG. 20, a substrate main body 31T is provided. A resist layer 61 having opening parts 61x corresponding to the electrodes 27 of the ceramic substrate 20S is formed on a surface 31c of the substrate main body 31T. The substrate main body 31T includes a plurality of regions which is finally made into pieces so that the silicon substrates 31 (see FIG. 19) are formed. As the substrate main body 31T, a thin-sized silicon wafer having a designated thickness or the like can be used. The silicon wafer has, for example, a circular-shaped planar configuration having a diameter of, for example, approximately 6 inches (approximately 150 mm), approximately 8 inches (approximately 200 mm), approximately 12 inches (approximately 300 mm), or the like. The thickness of the substrate main body 31T can be, for example, approximately 0.625 mm (in the case of 6 inches diameter), 0.725 mm (in the case of 8 inches diameter), and 0.775 mm (in the case of 12 inches diameter). The planar configuration of the ceramic substrate 20S and the substrate main body 31T may be or may not be circular-shaped. The planar configuration of the ceramic substrate 20S and the substrate main body 31T may be, for example, rectangular-shaped.

The resist layer 61 having the opening parts 61x is formed on the surface 31c of the substrate main body 31T. More specifically, liquid or paste resist made of photosensitive resin composition including, for example, epoxy group resin or imide group resin is applied on the surface 31c of the substrate main body 31T. Alternatively, film resist made of photosensitive resin composition including, for example, epoxy group resin or imide group resin is laminated on the surface 31c of the substrate main body 31T. By exposing and developing the applied or laminated resist, the opening parts 61x are formed. As a result of this, the resist layer 61 having the opening parts 61x is formed. A film resist where the opening parts 61x are formed in advance may be laminated on the surface 31c of the substrate main body 31T. The opening parts 61x are formed in positions corresponding to the electrodes 27. The pitch of the neighboring the opening parts 61x may be, for example, approximately 80 μm. The opening part 61x has, for example, a circular-shaped planar configuration (seen from the surface 31c or 31d side of the substrate main body 61) having a diameter of, for example, approximately 10 μm through approximately 200 μm.

Figure 21:
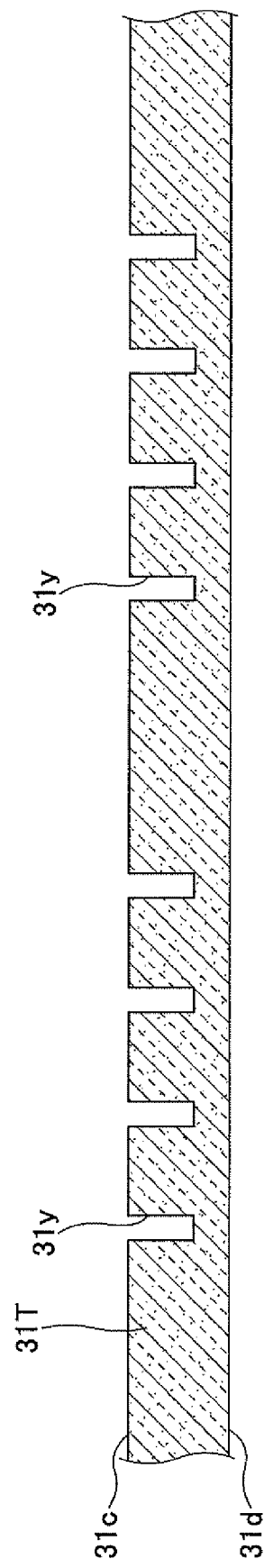
FIG. 21 is a second view of the example of the manufacturing steps of the wiring board of the second embodiment of the present invention.

Next, in a step illustrated in FIG. 21, the concave parts 31y are formed by etching the substrate main body 31T by using the resist layer 61 illustrated in FIG. 20 as a mask. Then, the resist layer 61 illustrated in FIG. 20 is removed. The concave parts 31y are formed in positions corresponding to the electrodes 27 of the ceramic substrate 20S. The concave parts 31y can be formed by an anisotropic etching method such as the DRIE (Deep Reactive Ion Etching) method using, for example, $SF_6$. The pitch of the neighboring concave parts 31y corresponds to the pitch of the opening parts 61x and can be, for example, approximately 80 μm. The concave part 31y has, for example, a circular-shaped planar configuration (seen from the surface 31c (main surface) side of the substrate main body 31T) having a diameter of, for example, approximately 10 μm through approximately 200 μm, corresponding to the diameter of the opening part 61x. The depth of the concave part 31y is set so that a piercing hole (via-hole) 31z can be formed in a step illustrated in FIG. 23.

Figure 22:
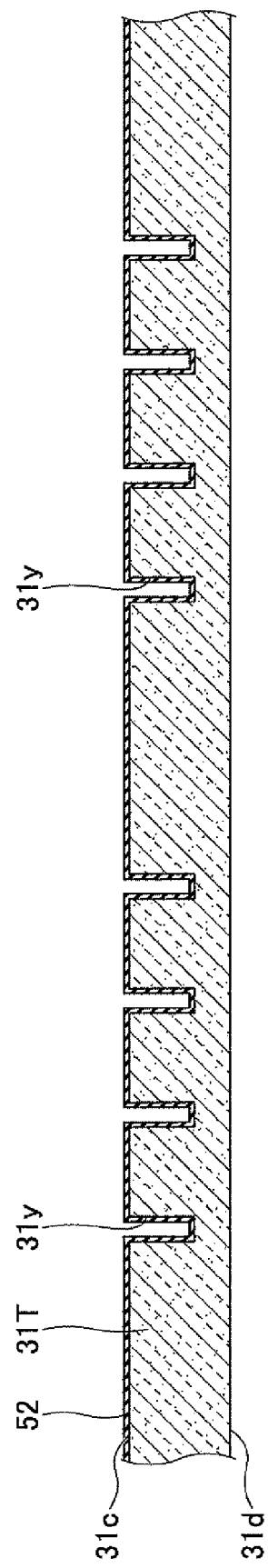
FIG. 22 is a third view of the example of the manufacturing steps of the wiring board of the second embodiment of the present invention.

Next, in a step illustrated in FIG. 22, an insulation layer 52 is formed on the surface 31c of the substrate main body 31T and inside surfaces and bottom surfaces of the concave parts 31y. Silicon dioxide ($SiO_2$) can be used as the insulation layer 52. The insulation layer 52 can be formed by thermal oxidation of the surface of the substrate main body 31T using a wet thermal oxidation method whereby a temperature in the vicinity of the surface of the substrate main body 31T becomes equal to or greater than approximately 1000 V. The thickness of the insulation layer 52 can be, for example, approximately 1 μm through approximately 2 μm.

Thus, by forming the insulation layer 52 with a thermal oxidation method such as the wet thermal oxidation method, compared to a case where an insulation material is applied by a spin coating method, it is possible to simplify the manufacturing process. Therefore, it is possible to reduce the manufacturing cost of the wiring board 50. Furthermore, the film of the insulation layer 52 can be made thicker by forming the insulation layer 52 by the wet thermal oxidation method, compared to by a dry thermal oxidation method.

In order to further improve insulation properties or reduce inserting loss, as well as the step illustrated in FIG. 9, it may be preferable to form the insulation layer made of benzocyclobutene (BCB) by the spin coating method or the like. The insulation layer made of benzocyclobutene (BOB) formed by the spin coating method or the like can be thicker than the insulation layer 52 formed by the thermal oxidation method. By making the insulation layer thicker, capacitance between the substrate main body 31T and the wiring layer 33 can be made small so that inserting loss can be reduced.

Figure 23:
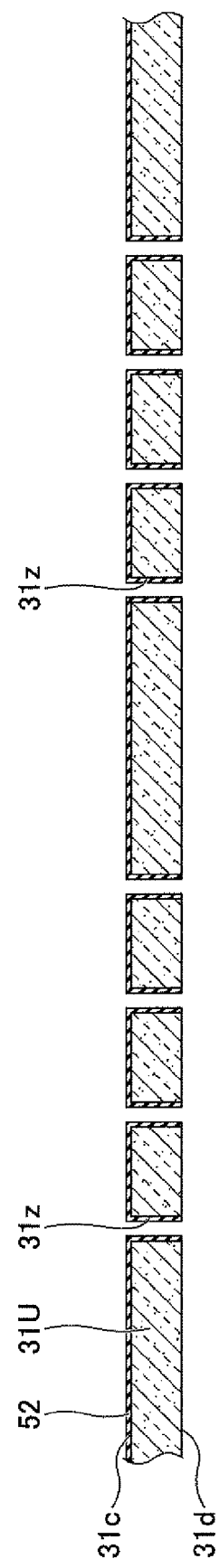
FIG. 23 is a fourth view of the example of the manufacturing steps of the wiring board of the second embodiment of the present invention.

Next, in a step illustrated in FIG. 23, the substrate main body 31T is ground from the surface 31d (rear surface) side so that the semiconductor substrate 31T has a thin plate-shaped configuration. By making the semiconductor substrate 31T have a thin plate-shaped configuration, the concave part 31y illustrated in FIG. 22 is pierced so that the via-hole 31z whose inside surface is covered with the insulation layer 52 is formed in a position where the electrode 27 of the ceramic substrate 20S is formed. A back side grinder, for example, can be used for making the thin plate-shaped configuration of the semiconductor substrate 31T. The substrate main body 31T after the substrate main body 31T is made thin is called a substrate main body 31U. The thickness of the semiconductor substrate main body 310 can be, for example, approximately 50 μm through approximately 500 μm.

Figure 24:
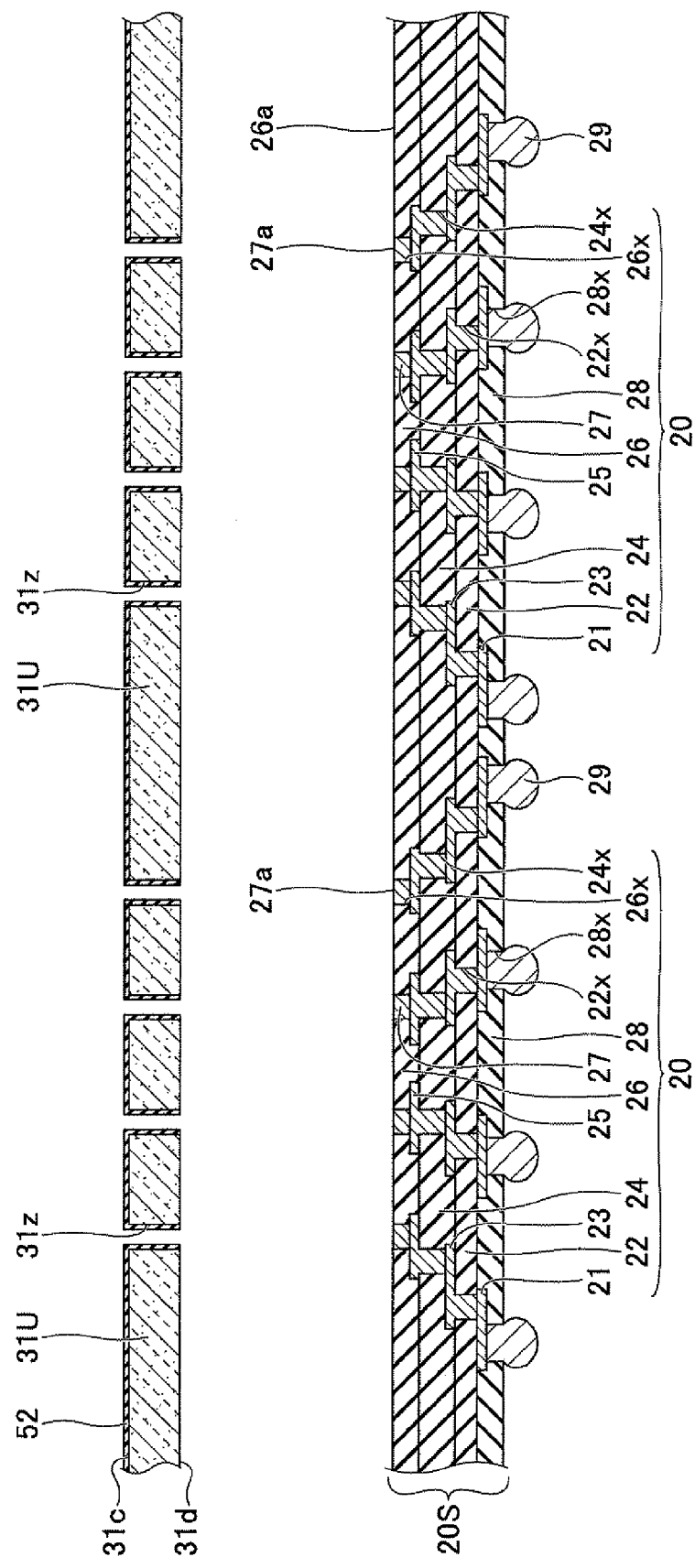
FIG. 24 is a fifth view of the example of the manufacturing steps of the wiring board of the second embodiment of the present invention.
Figure 25:
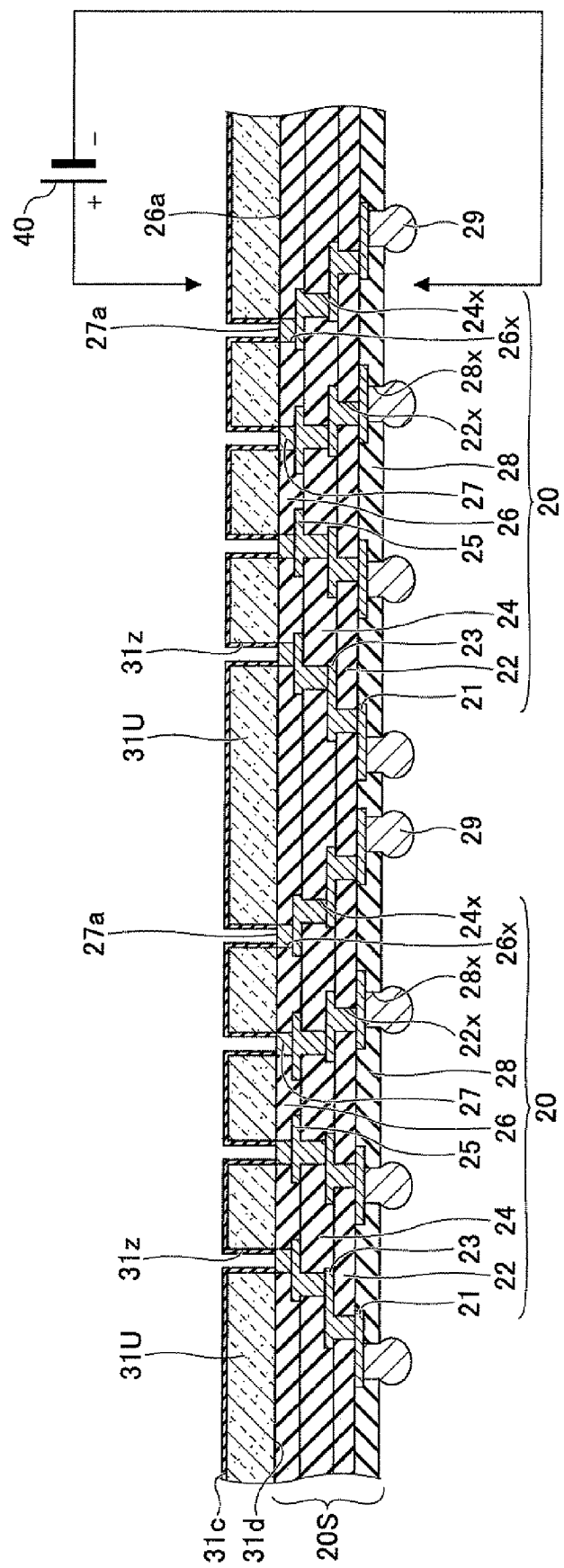
FIG. 25 is a sixth view of the example of the manufacturing steps of the wiring board of the second embodiment of the present invention.

Next, in a step illustrated in FIG. 24, a ceramic substrate 20S is provided. Since details of the ceramic substrate 20S of the second embodiment are substantially same as that of the first embodiment, explanation thereof is omitted. Next, in a step illustrated in FIG. 25, the electrodes 27 of the ceramic substrate 20S and the via-holes 31z of the substrate main body 310 are positioned and the ceramic substrate 20S and the substrate main body 31U are adhered to each other by anodic bonding. Since details of anodic bonding of the second embodiment are the same as those of the first embodiment, explanation thereof is omitted. Next, by performing the same steps as those of the first embodiment illustrated in FIG. 12 through FIG. 18, the wiring board 50 illustrated in FIG. 19 is completed.

As discussed above, according to the second embodiment of the present invention, the ceramic substrate and the substrate main body made of silicon are provided. The ceramic substrate includes stacked plural ceramic layers and internal wiring. An electrode electrically connected to the internal wiring is exposed from one surface of the ceramic substrate. The ceramic substrate has via-holes whose internal surfaces are covered with the insulation layer by a thermal oxidation method. The electrodes and the via-holes are positioned and the rear surface of the substrate main body is anodically bonded to the one of the surfaces (first surface) of the ceramic substrate. Furthermore, a wiring layer including via-fill and a wiring pattern formed on a main surface and electrically connected to the via-fill is formed so that the silicon substrate is completed. The via-fill is supplied in the via-hole where the insulation layer is formed. The via-fill is electrically connected to an electrode of the ceramic substrate. After that, the manufactured structural body is cut so as to make pieces and thereby the wiring board including the ceramic substrate and the silicon substrate is completed.

As a result of this, although this embodiment can achieve the same effect as that of the first embodiment, the following can be further achieved. In other words, by forming the insulation layer configured to insulate the substrate main body and the wiring pattern by a thermal oxidation method such as the wet thermal oxidation method, it is possible to simplify the manufacturing process compared to a case where the insulation material is applied by a spin coating method so that the manufacturing cost of the wiring board can be reduced.

(Third Embodiment)

In a third embodiment, an example of a manufacturing method of the wiring board 50 illustrated in FIG. 19, the method being different from the method discussed in the second embodiment, is discussed. FIG. 26 through FIG. 30 are views of an example of manufacturing steps of the wiring board of the third embodiment of the present invention. In FIG. 26 through 30, parts that are the same as the parts shown in FIG. 19 are given the same reference numerals, and explanation thereof is omitted.

Figure 26:
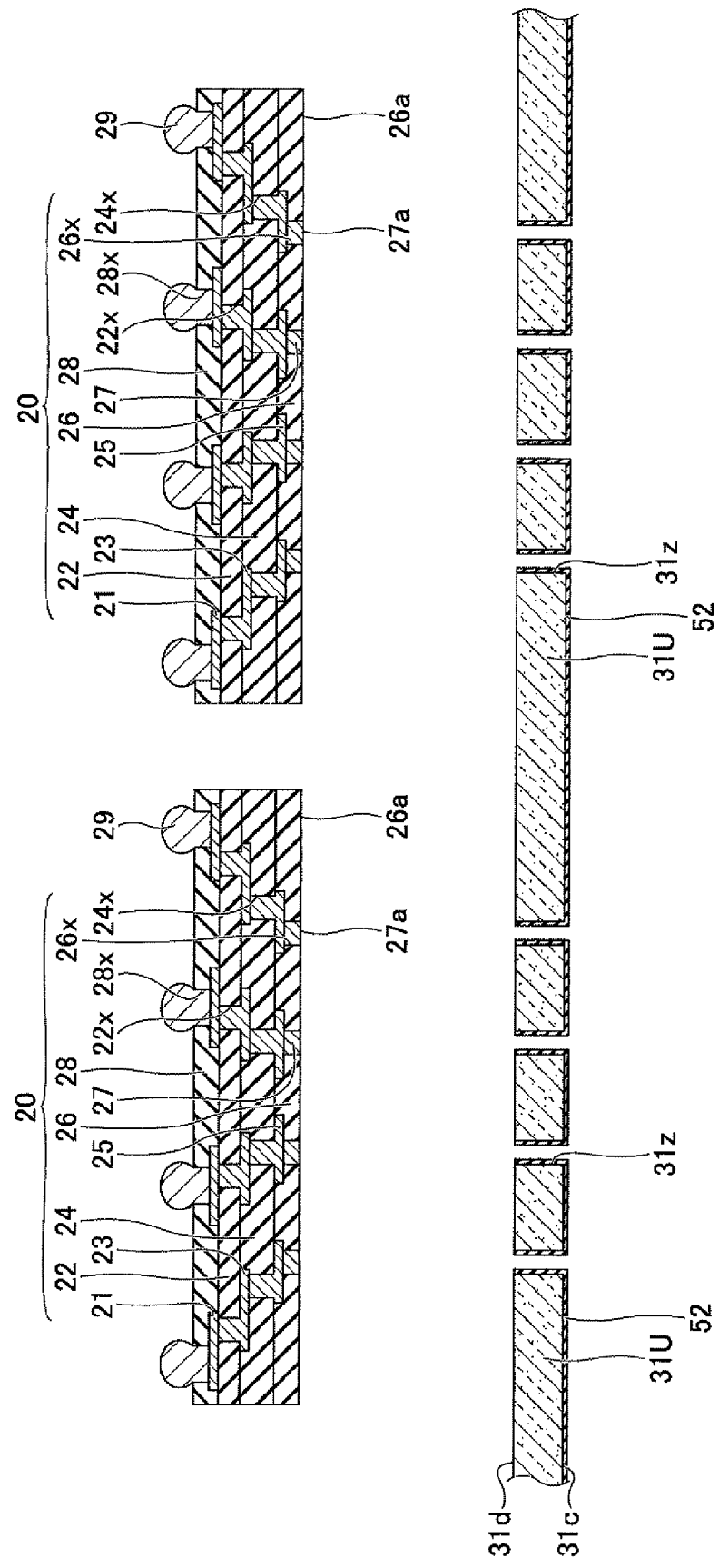
FIG. 26 is a first view of an example of manufacturing steps of a wiring board of a third embodiment of the present invention.

First, in a step illustrated in FIG. 26, by performing the same steps as the steps illustrated in FIG. 20 through FIG. 23 of the second embodiment, the substrate main body 31U where the insulation layer 52 is formed on the surface 31c and the inside surface of the via-holes 31z is provided. The thickness of the substrate main body 31U can be, for example, approximately 50 μm through approximately 500 μm. In addition, plural ceramic substrates 20 which are pieces of the ceramic substrate 20S are provided. FIG. 26 is a reverse view of FIG. 24 and other drawings.

Figure 27:
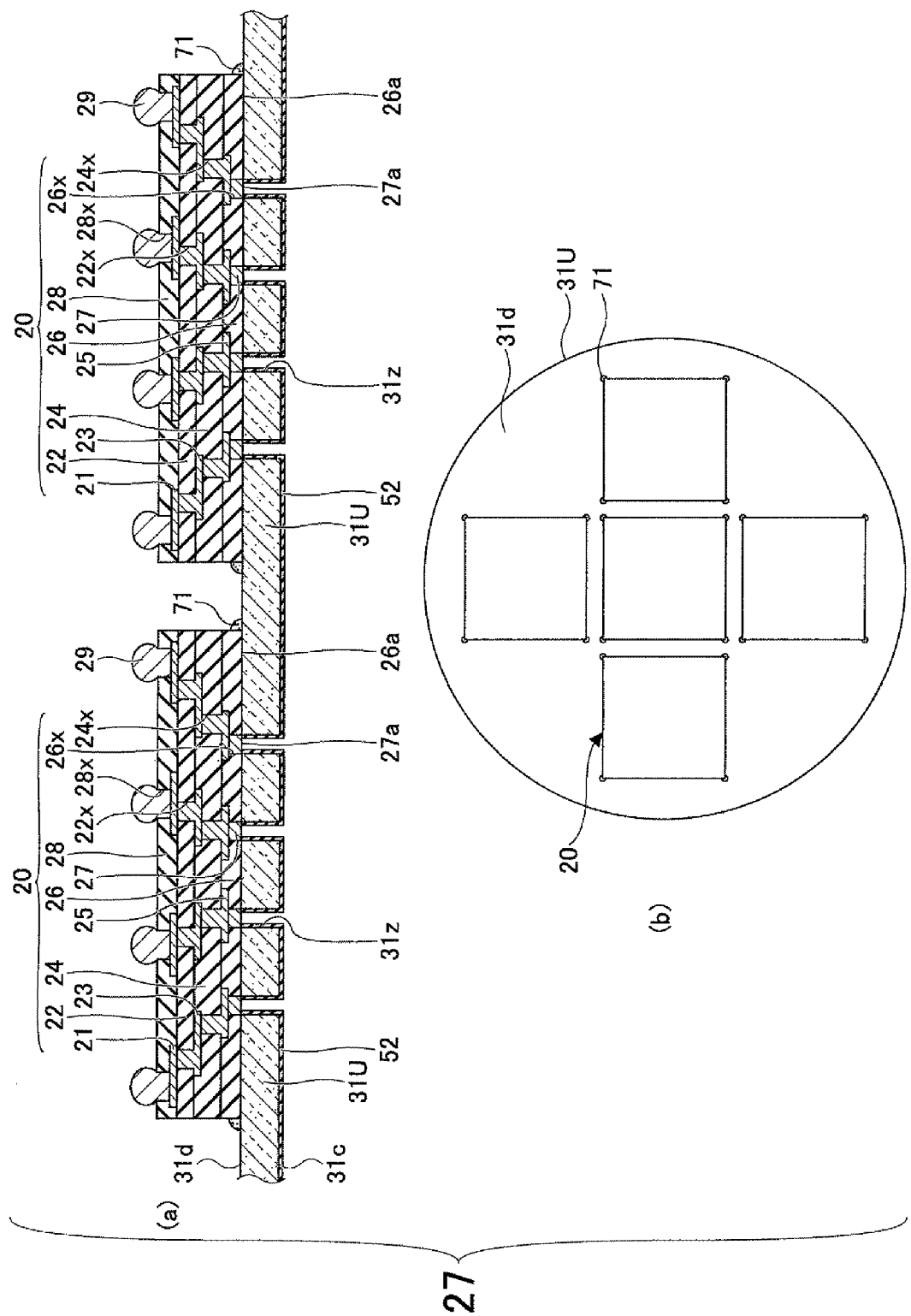
FIG. 27 is a second view of the example of the manufacturing steps of the wiring board of the third embodiment of the present invention.

Next, in a step illustrated in FIG. 27, the electrodes 27 of each of the ceramic substrates 20 and the via-holes 31z of the corresponding substrate main body 310 are positioned so that each of the ceramic substrates 20 is provided on the surface 31d of the substrate main body 31U. Resin 71 is applied at four corners of each of the ceramic substrates 20 so that each of the ceramic substrates 20 is provisionally fixed onto the surface 31d of the substrate main body 31U. For example, a flip chip bonder with high precision or the like can be used for positioning of the substrate main body 310 and each of the ceramic substrates 20. As the resin 71, for example, epoxy group resin, polyimide resin, or the like can be used. In FIG. 27, (a) is a cross-sectional view and (b) is a plan view.

Figure 28:
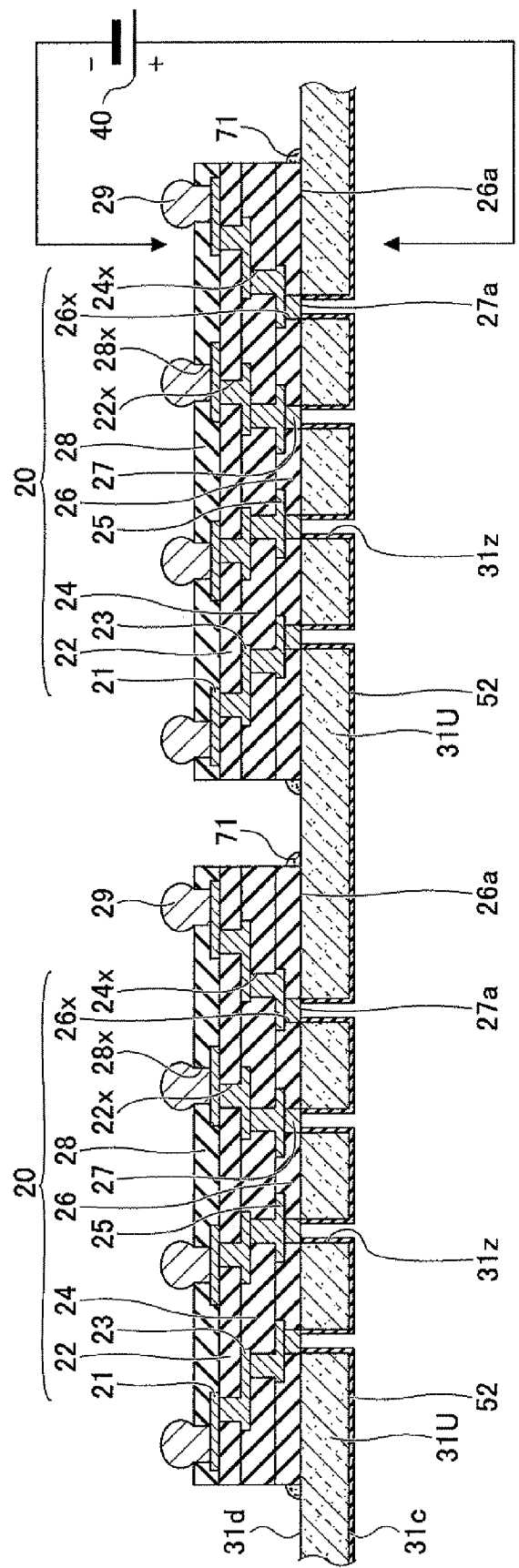
FIG. 28 is a third view of the example of the manufacturing steps of the wiring board of the third embodiment of the present invention.

Next, in a step illustrated in FIG. 28, the ceramic substrates 20 are adhered to the substrate main body 31U in a lump by anodic bonding. At this time, a high voltage such as approximately 500 V and approximately 1000 V is applied, from a DC electric power source 40, between an anode (not illustrated) electrically connected to the substrate main body 31U and a cathode electrically connected to each of the ceramic substrates 20, so that the substrate main body 31U has a high electric potential relative to each of the ceramic substrates 20. As a result of this, it is possible to anodically bond the ceramic substrates 20 to the substrate main body 31U in a lump. In addition, an electric characteristics inspection or the like of each of the ceramic substrates 20 is performed so as to determine a good or bad state in advance. By anodically bonding only good ceramic substrates 20 to the substrate main body 31U, it is possible to increase the yield rate of the wiring board 50.

Figure 29:
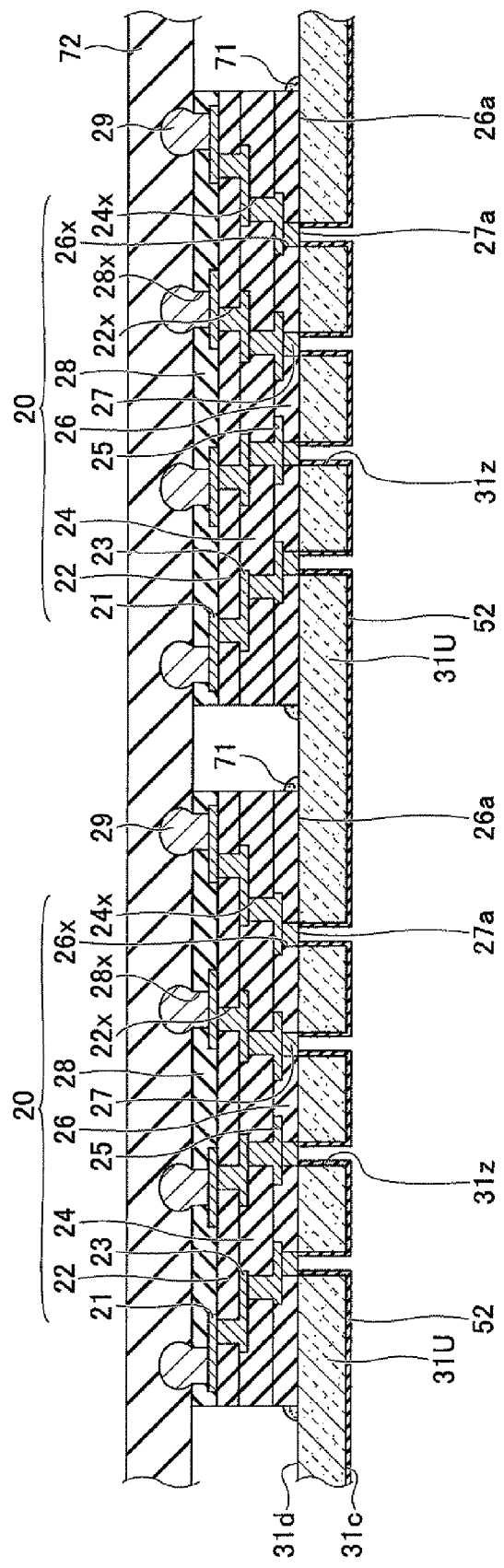
FIG. 29 is a fourth view of the example of the manufacturing steps of the wiring board of the third embodiment of the present invention.

Next, in a step illustrated in FIG. 29, a supporting board 72 is adhered to a side (second surface) opposite to the substrate main body 31U side (first surface) of each of the ceramic substrates 20. As a material of the supporting board 72, a material having good thermal resistance and drug resistance may be used. In addition, as the material of the supporting board 72, a material having flexibility may be used whereby heights of the external connecting terminals 29 can be accommodated. As an example of the supporting board 72, a thermal release tape, a PDS (Poly-dimethyl-siloxane) group tape, a reinforcing plate where the PDS group tape is adhered, or the like can be used. For example, the thickness of the supporting board 72 may be approximately 500 μm.

Figure 30:
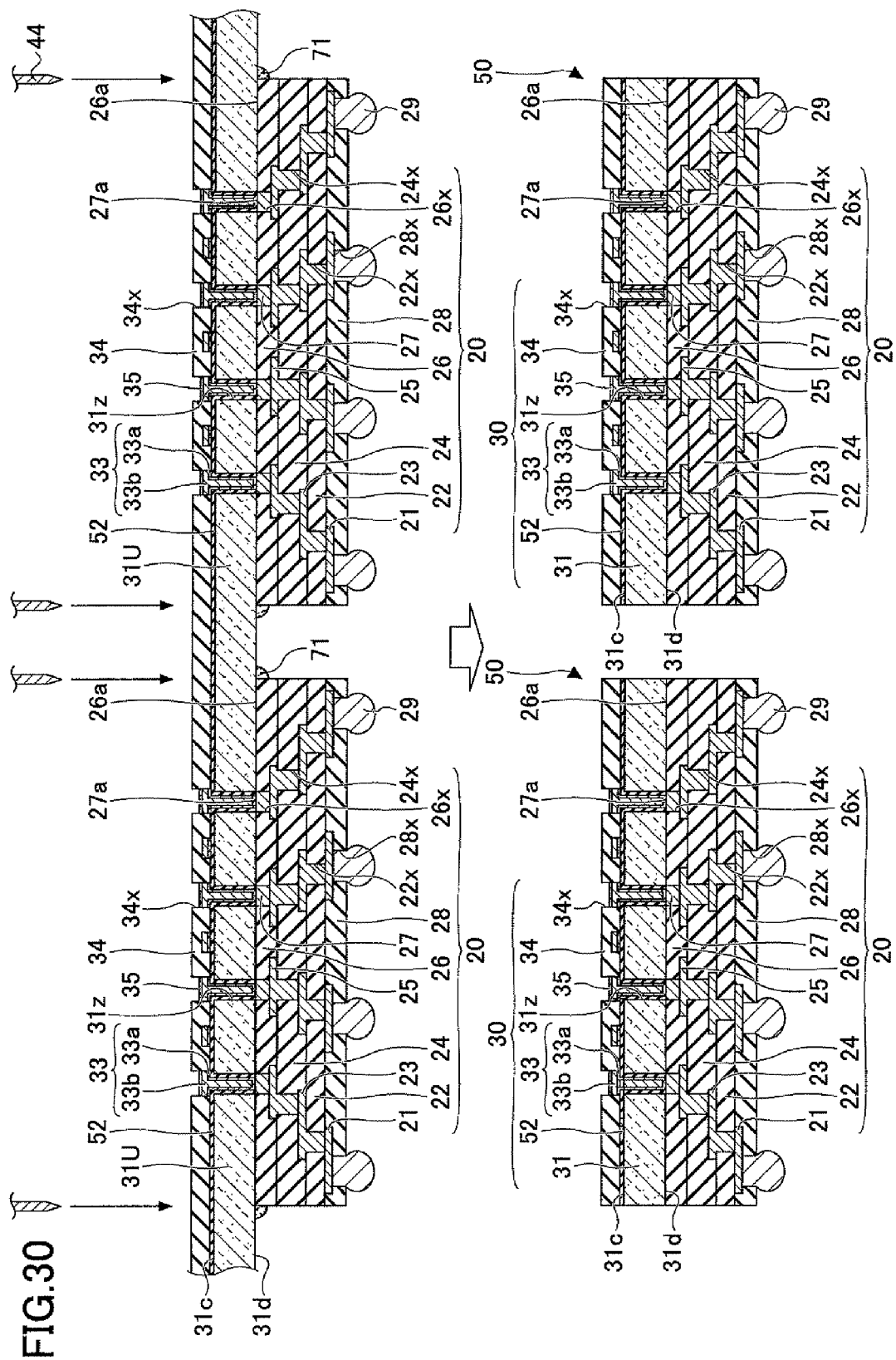
FIG. 30 is a fifth view of the example of the manufacturing steps of the wiring board of the third embodiment of the present invention.

Next, in a step illustrated in FIG. 30, a structural body illustrated in FIG. 29 is made upside down so that the supporting board 72 is situated at the lower side. After the substantially same steps as the steps illustrated in FIG. 12 through FIG. 18 of the first embodiment are performed so that the wiring layer 33 and others are formed, the supporting board 72 is removed and a structural body illustrated at an upper side in FIG. 30 is manufactured. The structural body illustrated at the upper side in FIG. 30 is cut in designated positions so that pieces of the structural body are made. As a result of this, the wiring board 50 having the silicon substrate 30 and the ceramic substrate 20 illustrated in FIG. 19 is completed. Cutting of the structural body illustrated at the upper side in FIG. 30 is done by dicing or the like using a dicing blade 44. As long as each of the pieces of the structural body illustrated at the upper side in FIG. 30 includes one of the ceramic substrates 20, the designated positions may be anywhere. For example, the designated positions may be positions where the resin 71 is applied. By cutting the substrate main body 31U, the substrate main body 31U becomes the substrate main body 31.

As discussed above, according to the third embodiment of the present invention, plural ceramic substrates and the substrate main body made of silicon are provided. The plural ceramic substrates are made by making pieces of a ceramic substrate including stacked plural ceramic layers and internal wiring. An electrode electrically connected to the internal wiring is exposed from one surface of the ceramic substrate. The ceramic substrate has via-holes whose internal surfaces are covered with the insulation layer by a thermal oxidation method. The electrodes and the via-holes are positioned and each of the ceramic substrates is anodically bonded to one of surfaces (rear surface) of the substrate main body. Furthermore, a wiring layer including via-fill and a wiring pattern formed on the main surface and electrically connected to the via-fill is formed so that the silicon substrate is completed. The via-fill is supplied in the via-hole where the insulation layer is formed. The via-fill is electrically connected to an electrode of the ceramic substrate. After that, the manufactured structural body is cut so as to make pieces and thereby the wiring board including the ceramic substrate and the silicon substrate is completed.

As a result of this, although this embodiment can achieve the same effect as that of the first embodiment, the following can be further achieved. In other words, the wiring board is manufactured after plural ceramic substrates are anodically bonded to one of the surfaces (rear surface) of the substrate main body. Therefore, an electric characteristics inspection or the like of each of the ceramic substrates 20 is performed so as to determine a good or bad state in advance. By anodically bonding only a good ceramic substrate to the substrate main body, it is possible to increase the yield rate of the wiring board 50.

Modified Example of the First through Third Embodiments

Figure 31:
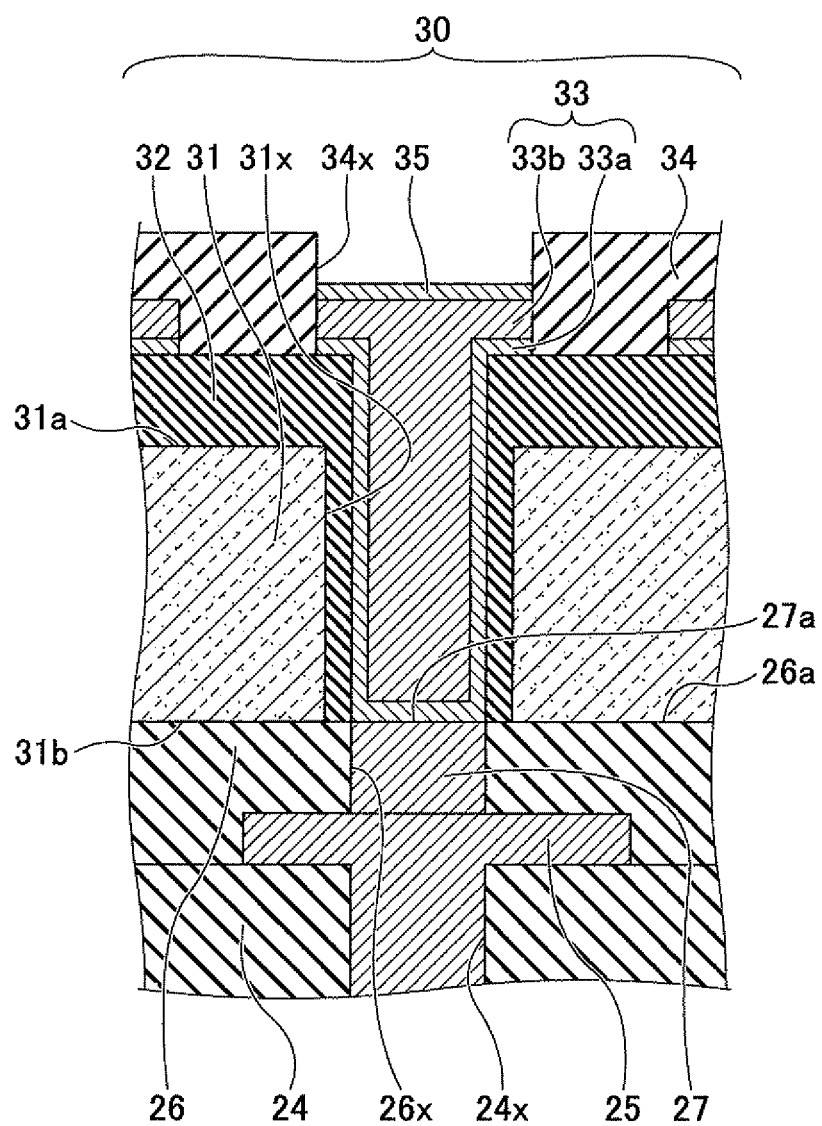
FIG. 31 is an expanded cross-sectional view of an example of a connecting part between a silicon substrate and a ceramic substrate of a wiring board of a modified example of the first embodiment of the present invention.
Figure 32:
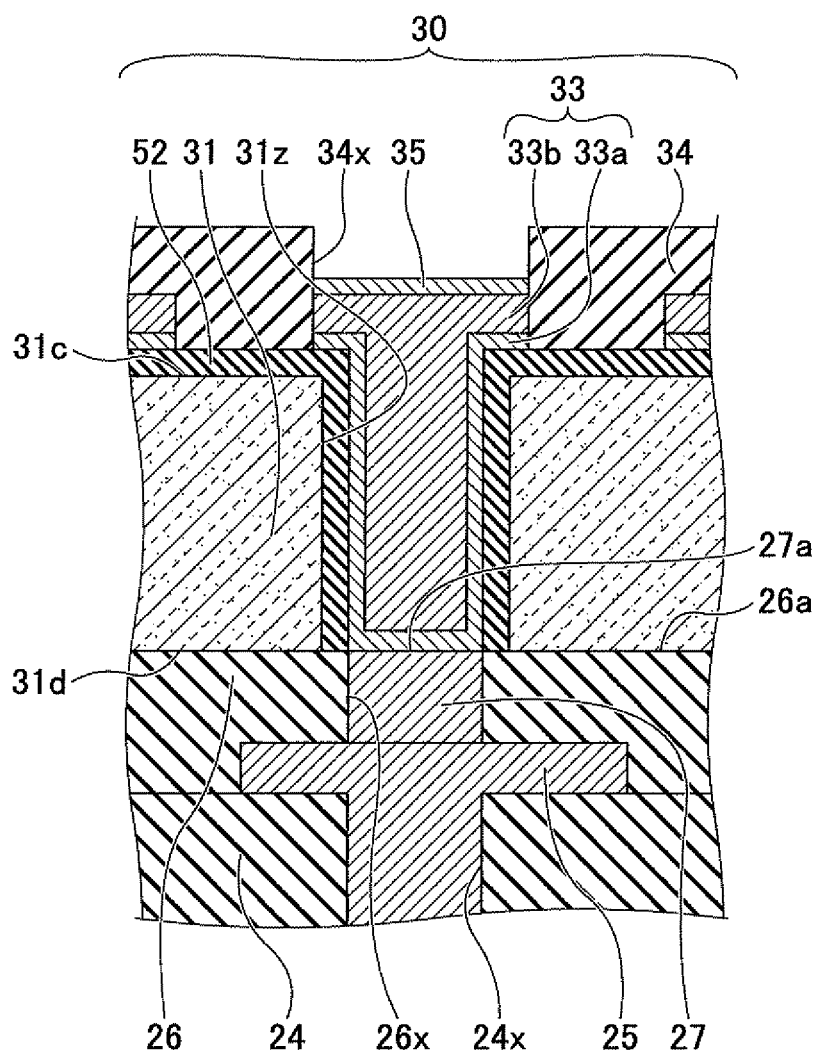
FIG. 32 is an expanded cross-sectional view of an example of a connecting part between a silicon substrate and a ceramic substrate of a wiring board of modified examples of the second and third embodiments of the present invention.

FIG. 31 is an expanded cross-sectional view of an example of a connecting part between a silicon substrate and a ceramic substrate of a wiring board of a modified example of the first embodiment of the present invention. In FIG. 31, parts that are the same as the parts shown in FIG. 4 are given the same reference numerals, and explanation thereof is omitted. FIG. 32 is an expanded cross-sectional view of an example of a connecting part between a silicon substrate and a ceramic substrate of a wiring board of modified examples of the second and third embodiments of the present invention. In FIG. 32, parts that are the same as the parts shown in FIG. 19 are given the same reference numerals, and explanation thereof is omitted.

In the first embodiment, the diameter of the via-hole 31*x* is substantially equal to the diameter of the surface 27*a* of the electrode 27. In addition, in the second and third embodiment, the diameter of the via-hole 31*z* is substantially equal to the diameter of the surface 27*a* of the electrode 27. However, as illustrated in FIG. 31 and FIG. 32, the diameter of the via-hole 31*x* or 31*z* may be greater than the diameter of the surface 27*a* of the electrode 27 so that the surface 27*a* of the electrode 27 may come in contact with the wiring layer 33 exposed at the bottom surface of the via-hole 31*x* or 31*z*. In this case, a central axis of the via hole 31*x* or 31*z* may be consistent with a central axis of the surface 27*a* of the electrode 27.

With this structure, the likelihood of the surface 27*a* of the electrode 27 directly coming in contact with the rear surface 31*b* or 31*d* of the substrate main body 31 can be decreased and thereby it is possible to securely achieve the insulation between the surface 27*a* of the electrode 27 and the substrate main body 31.

(Fourth Embodiment)

In a fourth embodiment of the present invention, an example of a semiconductor package where a semiconductor chip is mounted on the wiring board (see FIG. 4) of the first embodiment is discussed. In the fourth embodiment, explanation of parts that are common with the first embodiment is omitted and parts different from the first embodiment are mainly discussed.

[Structure of Semiconductor Package of the Fourth Embodiment]

Figure 33:
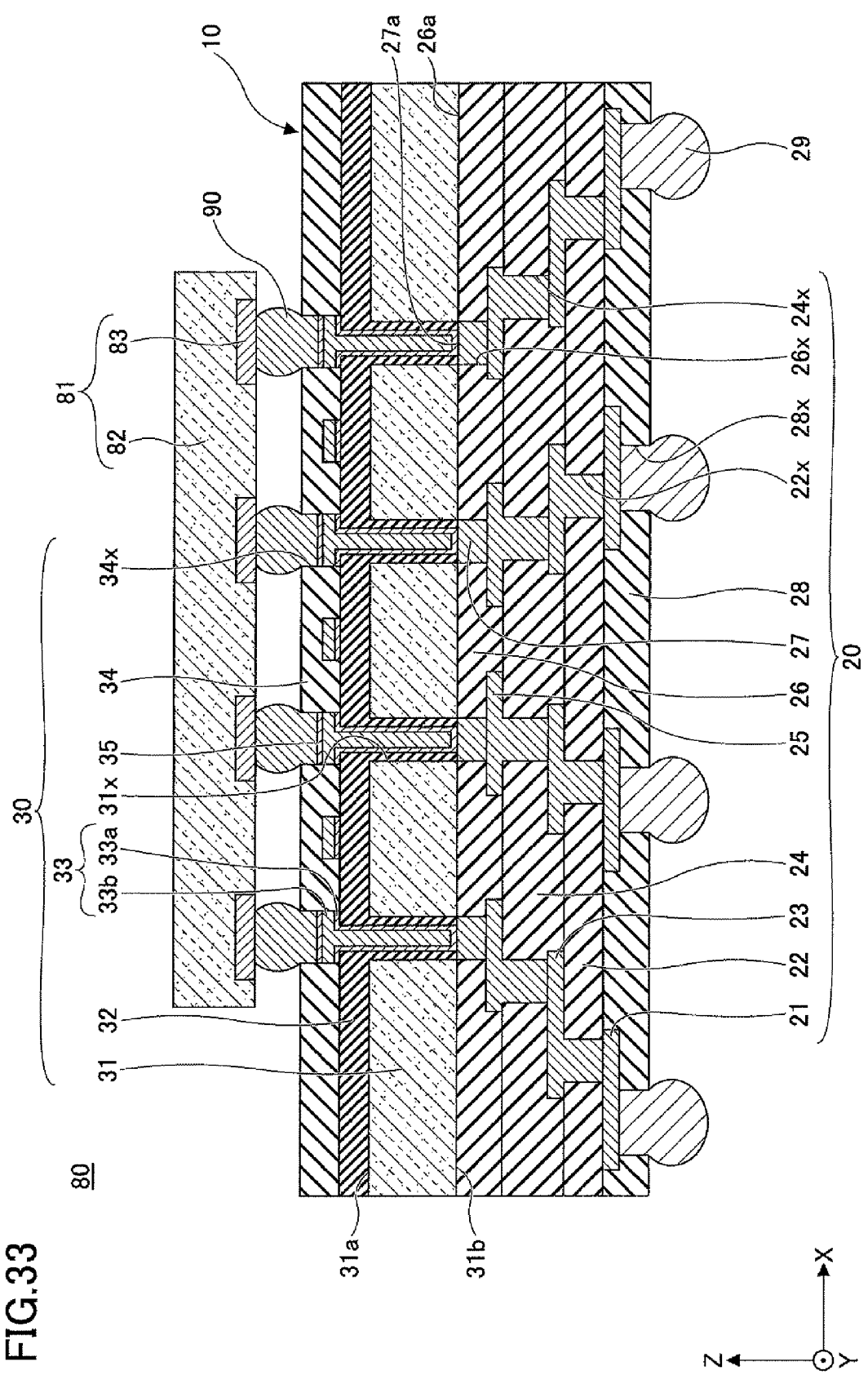
FIG. 33 is a cross-sectional view of an example of a wiring board of a fourth embodiment of the present invention.

FIG. 33 is a cross-sectional view of an example of a wiring board of the fourth embodiment of the present invention. In FIG. 33, parts that are the same as the parts shown in FIG. 4 are given the same reference numerals, and explanation thereof is omitted. As shown in FIG. 33, a semiconductor package 80 illustrated in FIG. 4 includes a semiconductor chip 81 and solder bumps 90.

The semiconductor chip 81 includes a semiconductor substrate 82 and electrode pads 83. In the semiconductor substrate 82, a semiconductor integrated circuit (not illustrated in FIG. 33) is formed on a substrate made of, for example, silicon (Si), germanium (Ge), or the like. The electrode pads 83 are formed on one of surfaces of the semiconductor substrate 82 so as to be electrically connected to the semiconductor integrated circuit (not illustrated in FIG. 33). As a material of the electrode pads 83, for example, aluminum (Al) or the like can be used. Alternatively, as the material of the electrode pads 83, a material where copper (Cu) and aluminum (Al) are stacked in this order, a material where copper (Cu), aluminum (Al), and silicon (Si) are stacked in this order, or the like can be used.

The solder bumps 90 electrically connect the third metal layer 35 of the wiring board 10 and the electrode pads 83 of the semiconductor chip 81. As a material of the solder bumps 90, for example, an alloy including Pb, an alloy of Sn and Cu, an alloy of Sn and Ag, an alloy of Sn, Ag, and Cu, or the like can be used.

[Manufacturing Method of the Wiring Board of the Fourth Embodiment]

Figure 34:
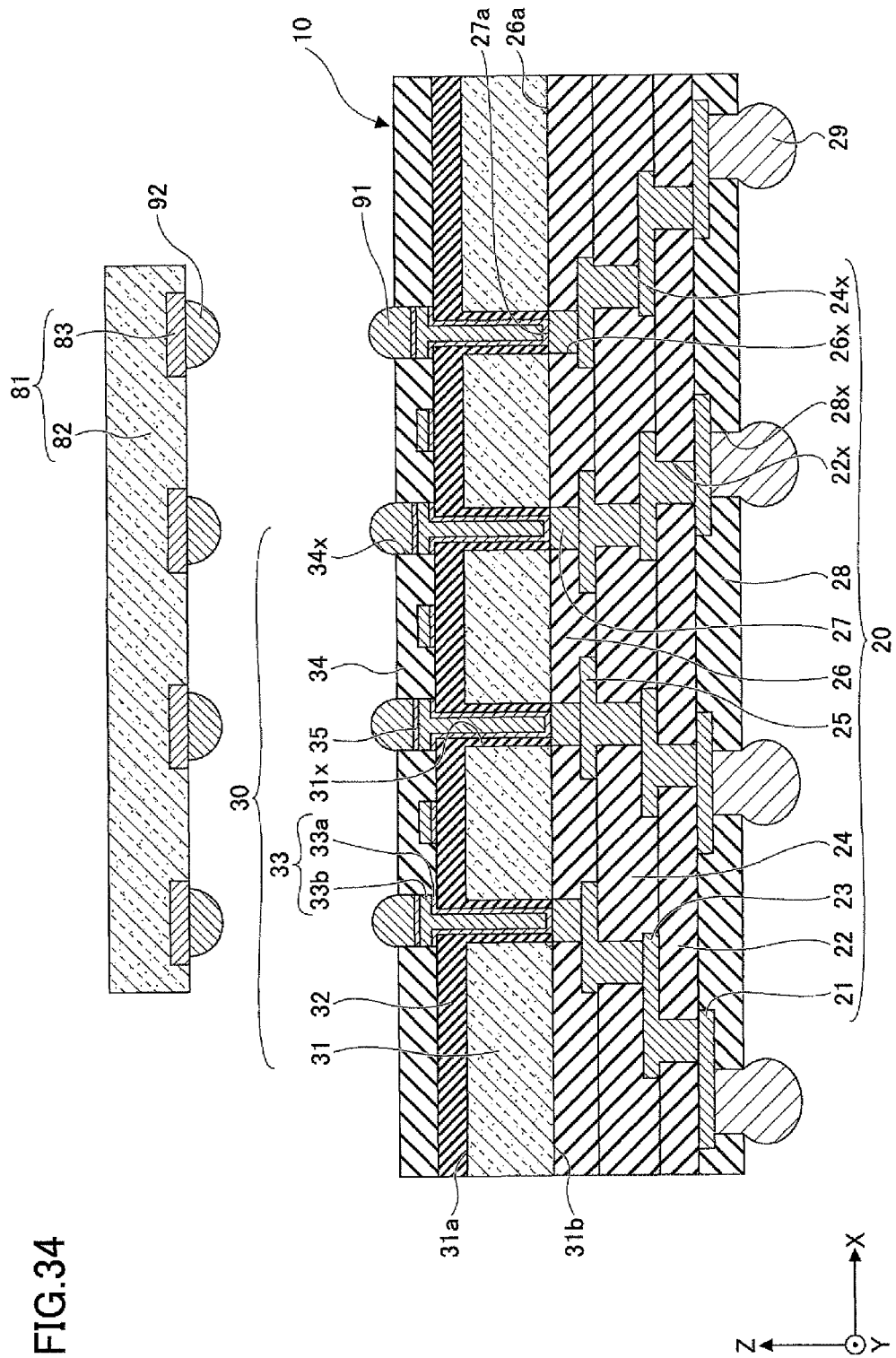
FIG. 34 is a first view of an example of manufacturing steps of the wiring board of the fourth embodiment of the present invention.
Figure 35:
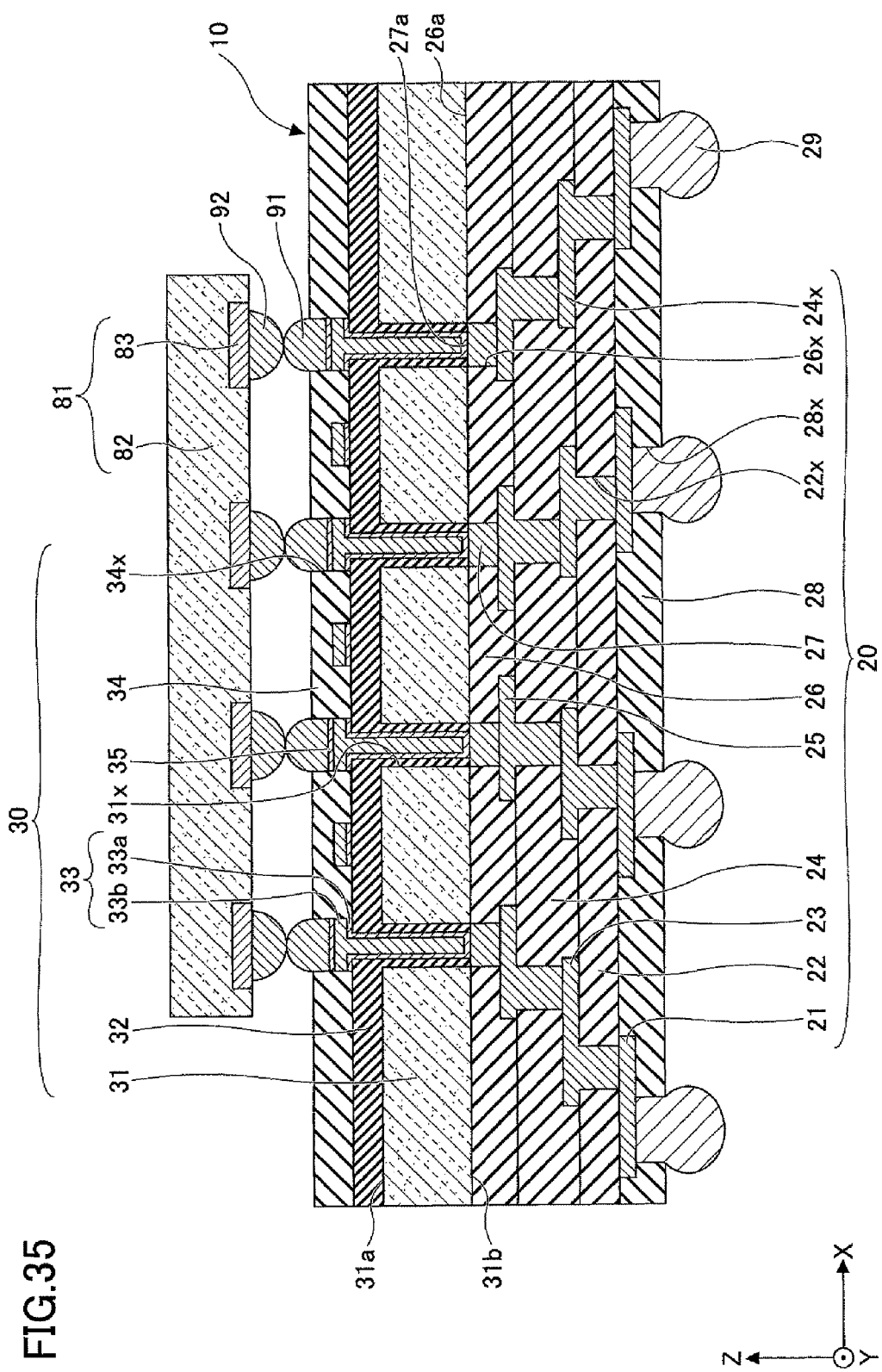
FIG. 35 is a second view of the example of the manufacturing steps of the wiring board of the fourth embodiment of the present invention.

Next, a manufacturing method of the wiring board of the fourth embodiment is discussed with reference to FIG. 34 and FIG. 35. FIG. 34 and FIG. 35 are views of an example of manufacturing steps of the wiring board of the fourth embodiment of the present invention. In FIG. 34 and FIG. 35, parts that are the same as the parts shown in FIG. 33 are given the same reference numerals, and explanation thereof is omitted.

First, in a step illustrated in FIG. 34, the wiring board 10 is provided. Pre-solder 91 is formed on the third metal layer 35. In addition, the semiconductor chip 81 is provided. Pre-solder 92 is formed on the electrode pads 83. The pre-solders 91 and 92 are formed by applying a solder paste made of an alloy including Pb, an alloy of Sn and Cu, an alloy of Sn and Ag, an alloy of Sn, Ag, and Cu, or the like on the third metal layer 35 and the electrode pads 83 and performing a reflow process.

Next, in a step illustrated in FIG. 35, the third wiring layer 35 side of the wiring board 10 and the electrode pad 83 side of the semiconductor chip 81 are made to face each other so that the pre-solders 91 and 92 are positioned so as to face each other. Then, the pre-solders 91 and 92 are heated at, for example, approximately 230° C. so that the solder is melted and thereby the solder bumps 90 are formed. Thus, the semiconductor package 80 illustrated in FIG. 33 is completed.

Thus, according to the fourth embodiment of the present invention, the semiconductor package has the semiconductor chip mounted on the wiring board of the first embodiment via the connecting terminals. Here, in the case where the semiconductor chip to be mounted is made of silicon, the CTEs of the semiconductor chip and the silicon substrate forming the wiring board are substantially equal to each other.

As a result of this, it is difficult to generate the thermal stress due to the difference of the CTEs at the connecting part of the semiconductor chip and the wiring board. Therefore, it is possible to improve connecting reliability between the wiring board and the semiconductor chip. In addition, since the connecting reliability between the wiring board and the semiconductor chip is improved, it is possible to eliminate a step of supplying the underfill resin between the semiconductor chip and the silicon substrate when the semiconductor package is manufactured.

The CTE of the ceramic layer, among the ceramic layers forming the ceramic substrate, far from the silicon substrate can be close to the CTE of the mounting board such as the motherboard by making the CTE of the ceramic layer far from the silicon substrate greater than the CTE of the ceramic layer close to the silicon substrate. As a result of this, it is difficult to generate thermal stress, due to differences of the CTEs, at the connecting part of the wiring board and the mounting board such as the motherboard. Therefore, it is possible to improve connection reliability of the connection between the wiring board and the mounting board such as the motherboard.

Modified Example 1 of the Fourth Embodiment

In a modified example 1 of the fourth embodiment, a modified example of the semiconductor package 80 (see FIG. 33) of the fourth embodiment is discussed. In the modified example 1 of the fourth embodiment, explanation of parts that are common with the fourth embodiment is omitted and parts different from the fourth embodiment are mainly discussed.

Figure 36:
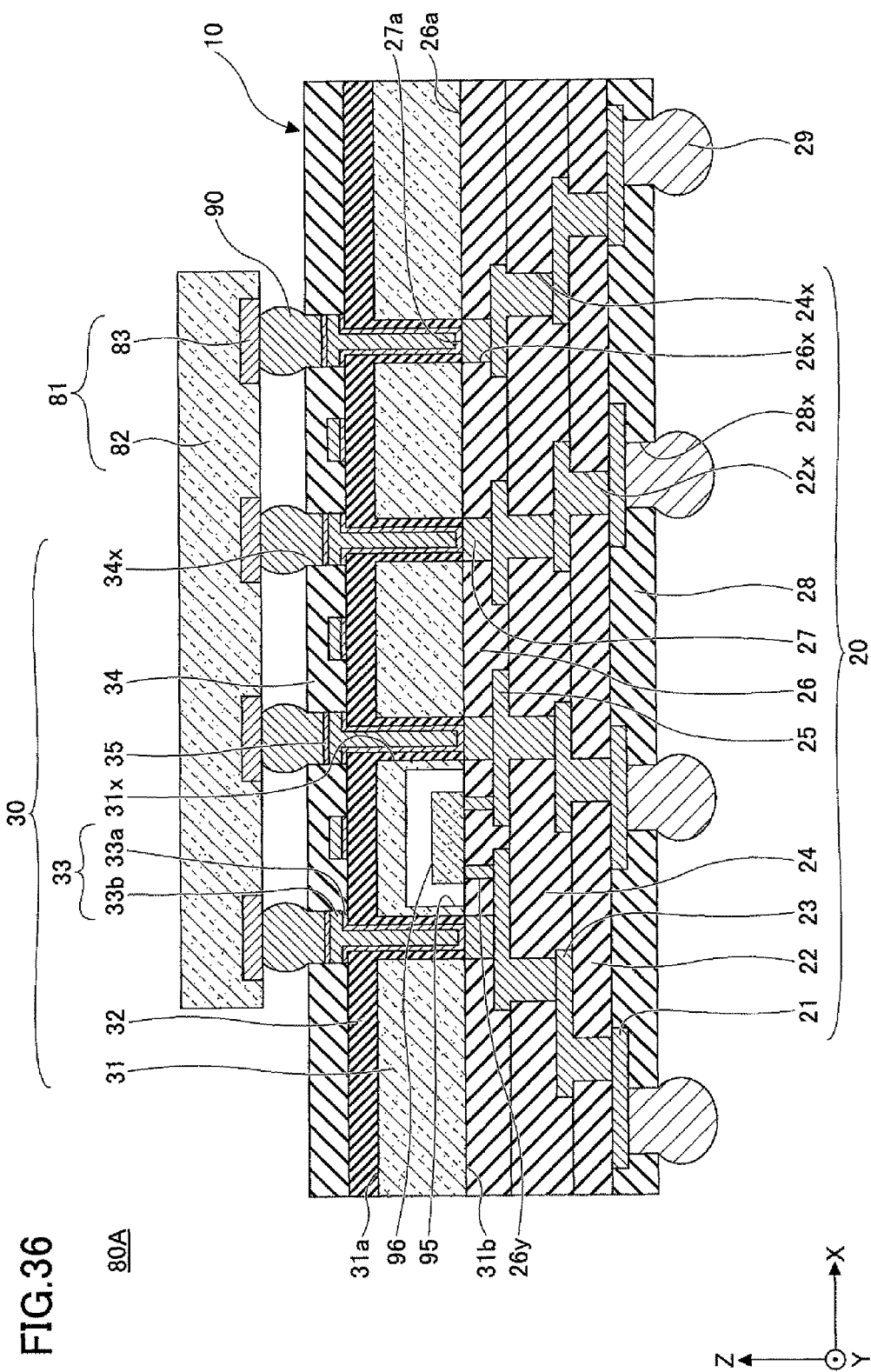
FIG. 36 is a cross-sectional view of a first modified example of a wiring board of the fourth embodiment of the present invention.

FIG. 36 is a cross-sectional view of the first modified example of a wiring board of the fourth embodiment of the present invention. In FIG. 36, parts that are the same as the parts shown in FIG. 33 are given the same reference numerals, and explanation thereof is omitted. As shown in FIG. 36, in a semiconductor package 80A, a cavity part 95 is provided in the substrate main body 31 of the wiring board 10. A MEMS (Micro Electra Mechanical Systems) device 96 is provided in the cavity part 95.

The cavity part 95 can be formed in the substrate main body 31 by an anisotropic etching method such as the DRIE (Deep Reactive Ion Etching) method using, for example, $SF_6$, before the substrate main body 31 and the ceramic substrate 20 are anodically bonded. The MEMS device 96 is electrically connected to the third wiring layer 25 by the via-fill supplied in the fourth via-holes 26y. The MEMS device 96 can be mounted on the ceramic substrate 20 before the substrate main body 31 and the ceramic substrate 20 are anodically bonded. As an example of the MEMS device 96, for example, a pressure sensor or an acceleration sensor can be used. The semiconductor chip 81 is configured to control the MEMS device 96.

As a result of this, although this embodiment can achieve the same effect as that of the first embodiment, the following can be further achieved. In other words, the cavity part is provided in the substrate main body of the wiring board. The MEMS device is provided in the cavity part. The semiconductor chip is configured to control the MEMS device provided in the wiring board. Hence, it is possible to realize the semiconductor package having the MEMS device, the semiconductor package being where the control of the MEMS device can be performed.

Modified Example 2 of the Fourth Embodiment

In a modified example 2 of the fourth embodiment, another modified example of the semiconductor package 80 (see FIG. 33) of the fourth embodiment is discussed. In the modified example 2 of the fourth embodiment, explanation of parts that are common with the fourth embodiment is omitted and parts different from the fourth embodiment are mainly discussed.

Figure 37:
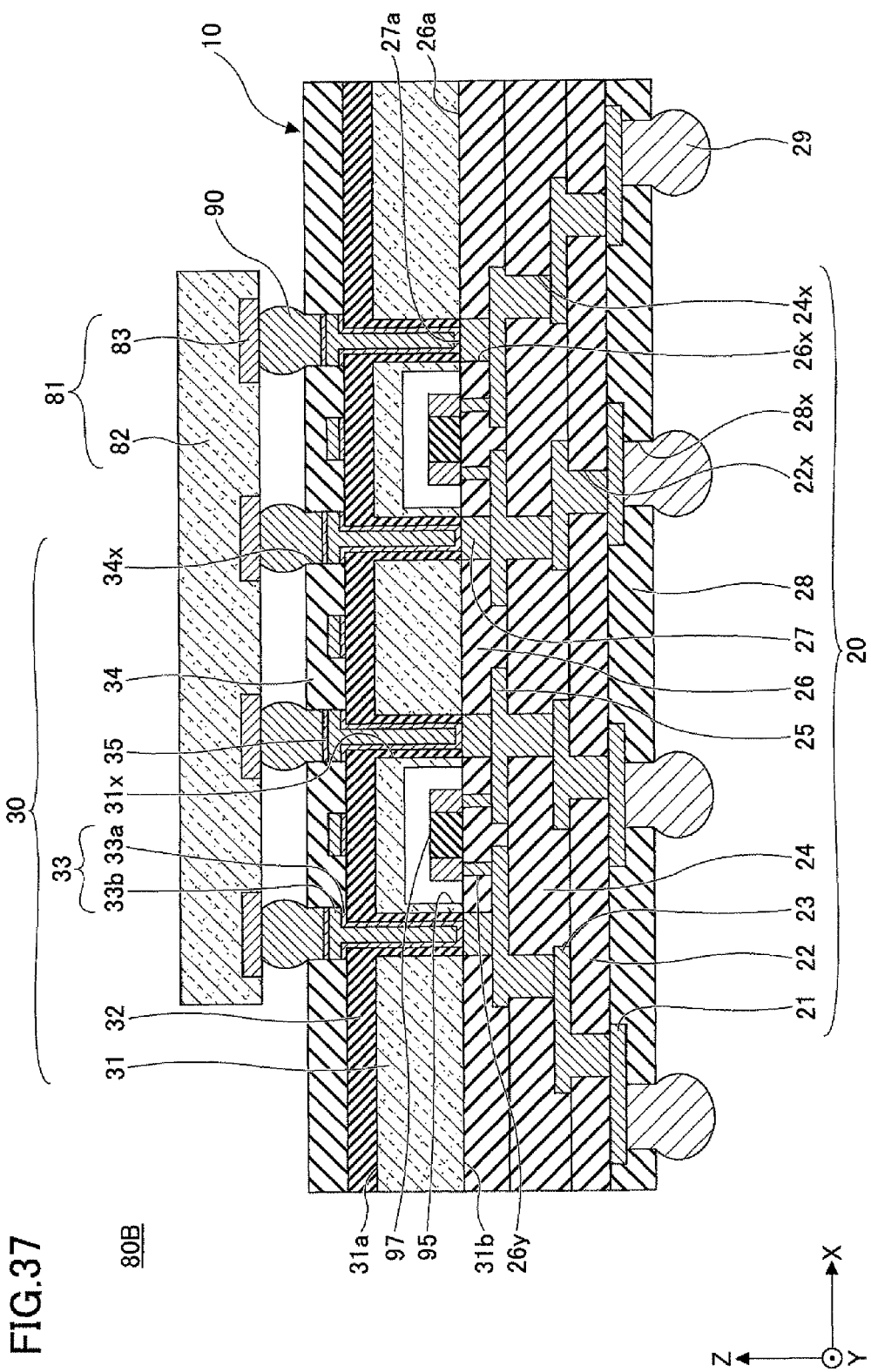
FIG. 37 is a cross-sectional view of a second modified example of a wiring board of the fourth embodiment of the present invention.

FIG. 37 is a cross-sectional view of the second modified example of a wiring board of the fourth embodiment of the present invention. In FIG. 37, parts that are the same as the parts shown in FIG. 33 are given the same reference numerals, and explanation thereof is omitted. As shown in FIG. 37, in a semiconductor package 80B, a cavity part 95 is provided in the substrate main body 31 of the wiring board 10. A capacitor (chip capacitor) 97 is provided in the cavity part 95.

The cavity part 95 can be formed in the substrate main body 31 by an anisotropic etching method such as the DRIE (Deep Reactive Ion Etching) method using, for example, $SF_6$, before the substrate main body 31 and the ceramic substrate 20 are anodically bonded.

The capacitor 97 is electrically connected to the third wiring layer 25 by the via-fill supplied in the fourth via-hole 26y. The capacitor may be provided right under the semiconductor chip 81. The capacitor 97 can be mounted on the ceramic substrate 20 before the substrate main body 31 and the ceramic substrate 20 are anodically bonded.

According to the modified example 2 of the fourth embodiment, although this embodiment can achieve the same effect as that of the first embodiment, the following can be further achieved. In other words, the cavity part is provided in the substrate main body of the wiring board. The capacitor is provided in the cavity part. Hence, it is possible to provide the capacitor right under the semiconductor chip, and therefore the electric characteristics of the semiconductor package can be improved. In the cavity part 95, not only the capacitor (chip capacitor) but also various kinds of the electronic components such as a resistor or inductor can be mounted.

Modified Example 3 of the Fourth Embodiment

In a modified example 3 of the fourth embodiment, another modified example of the semiconductor package 80 (see FIG.

33) of the fourth embodiment is discussed. In the modified example 3 of the fourth embodiment, explanation of parts that are common with the fourth embodiment is omitted and parts different from the fourth embodiment are mainly discussed.

Figure 38:
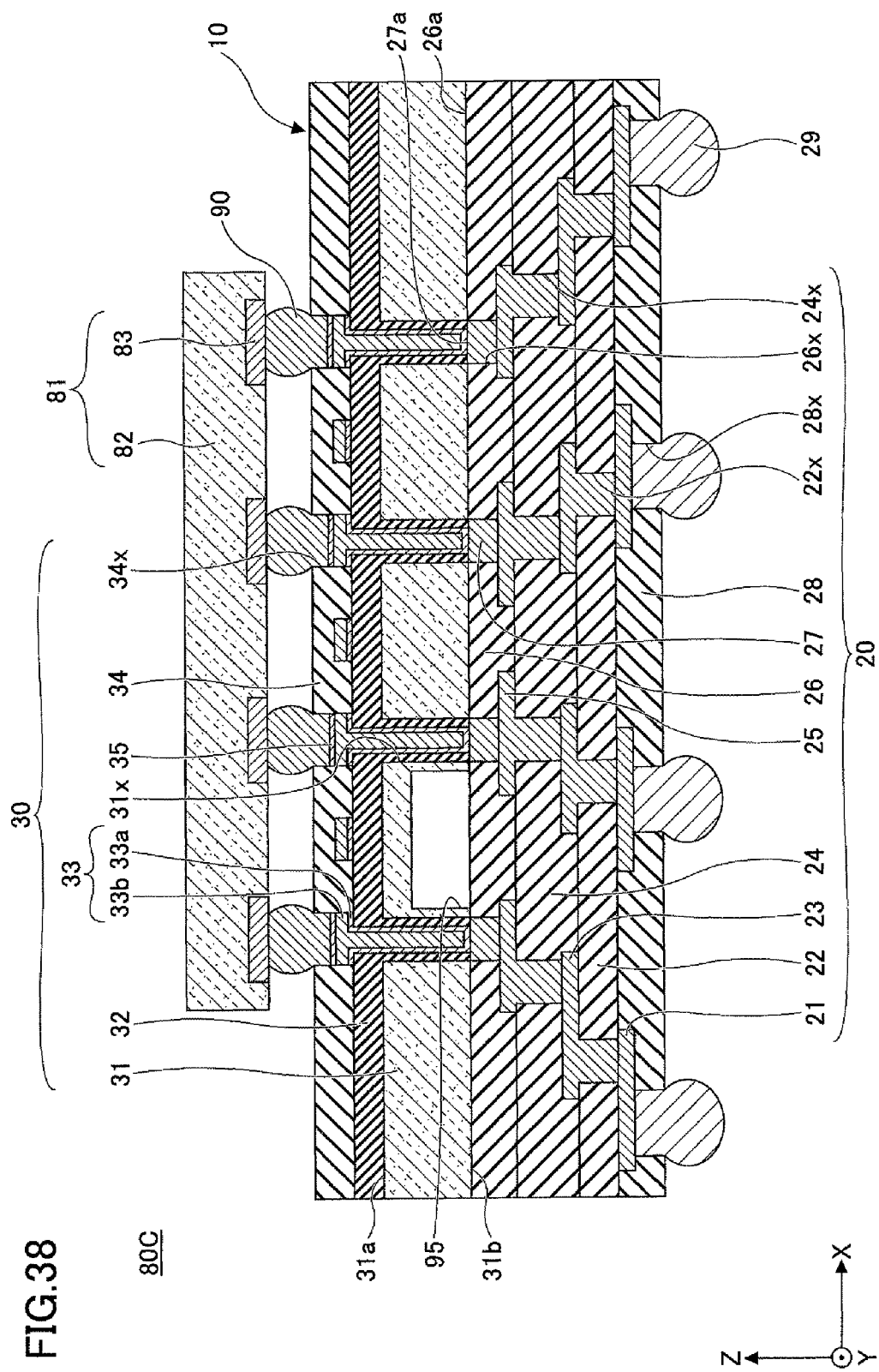
FIG. 38 is a cross-sectional view of a third modified example of a wiring board of the fourth embodiment of the present invention.

FIG. 38 is a cross-sectional view of the third modified example of a wiring board of the fourth embodiment of the present invention. In FIG. 38, parts that are the same as the parts shown in FIG. 33 are given the same reference numerals, and explanation thereof is omitted. As shown in FIG. 38, in a semiconductor package 80C, a cavity part 95 is provided in the substrate main body 31 of the wiring board 10. The cavity part 95 is used as a coolant flow path where a coolant such as water is supplied.

The cavity part 95 can be formed in the substrate main body 31 by an anisotropic etching method such as the DRIE (Deep Reactive Ion Etching) method using, for example, $SF_6$, before the substrate main body 31 and the ceramic substrate 20 are anodically bonded. The cavity part 95 may be provided right under the semiconductor chip 81.

According to the modified example 3 of the fourth embodiment, although this embodiment can achieve the same effect as that of the fourth embodiment, the following can be further achieved. In other words, the cavity part is provided in the substrate main body of the wiring board. The cavity part is used as a coolant flow path where a coolant such as water is supplied. Hence, it is possible to provide the coolant flow path right under the semiconductor chip, and therefore to improve heat radiation capabilities of the semiconductor package.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

For example, the following method may be applied. That is, plural ceramic substrates 20 and the substrate main body 31S are provided. After each of the ceramic substrates 20 is anodically adhered to the substrate main body 31S, the via holes are formed in the substrate main body 31S so that the wiring layer is formed.

In addition, the fourth embodiment and its modified examples may be applied to the wiring board 50.

What is claimed is:

1. A wiring board, comprising:
a ceramic substrate including a plurality of stacked ceramic layers, an internal wiring, and an electrode, the internal wiring being electrically connected to the electrode, the electrode being exposed from a first surface of the ceramic substrate; and
a silicon substrate including a wiring layer, the wiring layer including a wiring pattern and a via-fill, the wiring pattern being formed on a main surface of the silicon substrate, an end of the via-fill being electrically connected to the wiring pattern, another end of the via-fill being exposed from a rear surface of the silicon substrate positioned opposite to the main surface,
wherein the rear surface of the silicon substrate is anodically bonded to the first surface of the ceramic substrate;
the via-fill of the silicon substrate is directly connected to the electrode of the ceramic substrate, and
a thin film made of silicon dioxide is formed at a border of the rear surface of the silicon substrate and the first surface of the ceramic substrate, said thin film having a thickness necessary for the rear surface of the silicon substrate to be anodically bonded to the first surface of the ceramic substrate.

2. The wiring board as claimed in claim 1, wherein each of the ceramic layers includes sodium oxide.

3. The wiring board as claimed in claim 1, wherein each of the ceramic layers includes alumina cordierite.

4. The wiring board as claimed in claim 1, wherein a coefficient of thermal expansion of the ceramic layer far from the silicon substrate is greater than the coefficient of thermal expansion of the ceramic layer close to the silicon substrate.

5. The wiring board as claimed in claim 1, wherein a cavity part is formed at the rear surface of the silicon substrate so as to expose the first surface of the ceramic substrate.

6. A semiconductor package, comprising
the wiring board as claimed in claim 1; and
a semiconductor chip mounted on the main surface of the silicon substrate of the wiring board.

7. The wiring board as claimed in claim 3, wherein each of the ceramic layers includes a different amount of the alumina cordierite.

8. The wiring board as claimed in claim 5, wherein a MEMS device is mounted on the first surface of the ceramic substrate in the cavity part.

9. The wiring board as claimed in claim 5, wherein a capacitor is mounted on the first surface of the ceramic substrate in the cavity part.

10. The wiring board as claimed in claim 5, wherein the cavity part is a coolant flow path where a coolant is supplied.

* * * * *